US 8,421,998 B2

(12) United States Patent
Shiraishi et al.

(10) Patent No.: US 8,421,998 B2
(45) Date of Patent: Apr. 16, 2013

(54) OPTICAL SYSTEM, EXPOSURE APPARATUS, AND METHOD OF MANUFACTURING ELECTRONIC DEVICE

(75) Inventors: Masayuki Shiraishi, Kumagaya (JP); Takuro Ono, Okegawa (JP)

(73) Assignee: Nikon Corporation, Tokyo (JP)

( * ) Notice: Subject to any disclaimer, the term of this patent is extended or adjusted under 35 U.S.C. 154(b) by 616 days.

(21) Appl. No.: 12/585,571

(22) Filed: Sep. 17, 2009

(65) Prior Publication Data
US 2010/0149509 A1 Jun. 17, 2010

Related U.S. Application Data

(60) Provisional application No. 61/136,704, filed on Sep. 26, 2008.

(30) Foreign Application Priority Data

Sep. 18, 2008 (JP) ................................. 2008-239478

(51) Int. Cl.
G03B 27/72 (2006.01)
G03B 27/54 (2006.01)
(52) U.S. Cl.
USPC .............................................. 355/71; 355/67

(58) Field of Classification Search .................... 355/67, 355/71
See application file for complete search history.

(56) References Cited

U.S. PATENT DOCUMENTS

| 8,009,343 B2* | 8/2011 | Gellrich et al. ............... 359/234 |
| 2006/0245057 A1* | 11/2006 | Van Herpen et al. ......... 359/587 |
| 2007/0008509 A1 | 1/2007 | Shiraishi |
| 2007/0053076 A1* | 3/2007 | Bieg et al. ..................... 359/738 |
| 2007/0058269 A1 | 3/2007 | Mann et al. |
| 2007/0223112 A1* | 9/2007 | Mann et al. ................... 359/726 |
| 2008/0259308 A1* | 10/2008 | Epple .............................. 355/71 |

FOREIGN PATENT DOCUMENTS

| JP | 2005-086148 | 3/2005 |
| JP | 2009-253048 | 10/2009 |
| WO | 2004/046771 A1 | 6/2004 |
| WO | WO 2005019878 A1 * | 3/2005 |
| WO | 2007/004358 A1 | 1/2007 |

* cited by examiner

Primary Examiner — Toan Ton
Assistant Examiner — Michelle Iacoletti

(57) ABSTRACT

An aperture diaphragm plate is provided to define a light flux on a pupil plane of an optical system or a plane or surface disposed in the vicinity of the pupil plane. An aperture, which is formed in the aperture diaphragm plate, has a three-dimensional shape corresponding to an optimum pupil shape of the optical system. It is possible to improve the imaging characteristic brought about by the optical system by providing the optimum pupil shape of the optical system.

63 Claims, 31 Drawing Sheets

OPTICAL SYSTEM, EXPOSURE APPARATUS, AND METHOD OF MANUFACTURING ELECTRONIC DEVICE

CROSS-REFERENCES TO RELATED APPLICATIONS

This application claims the benefit of priority of Japanese Patent Application No. 2008-239478 filed on Sep. 18, 2008 and U.S. Provisional Application Ser. No. 61/136,704 filed on Sep. 26, 2008, the entire disclosures of which are incorporated herein by reference in their entireties.

BACKGROUND OF THE INVENTION

1. Field of the Invention

The present invention relates to an aperture diaphragm which is arranged in an optical system, the optical system, and an exposure apparatus. The present invention is preferably usable for an optical system of an exposure apparatus which is used in the lithography step of producing a device including a liquid crystal display element, a semiconductor element, etc. The present invention also relates to a method for producing an electronic device using the exposure apparatus.

2. Description of the Related Art

In recent years, an exposure technique, which is using the EUV (Extreme Ultra-Violet light, Extreme Ultra-Violet light beam) having a shorter wavelength (about 11 to 14 nm), instead of the conventional ultraviolet light, has been developed in order to improve the resolving power of the optical system restricted by the diffraction limit of the light, as the semiconductor integrated circuit becomes fine and minute. Accordingly, it is expected that the exposure can be performed with a pattern size of about 22 to 45 nm. The refractive index of a substance is close to 1 in the wavelength region of the EUV light. Therefore, it is impossible to use the transmission dioptric optical element such as the conventional lens; and the mirror, which is an optical element of the reflection type, is used.

An exposure apparatus (hereinafter referred to as "EUV exposure apparatus"), which uses the EUV light as the exposure light (exposure light beam), is constructed to include a light source which generates the EUV light; a group of illumination optical system mirrors which shape the light beam (light); a reflection type mask; a group of projection optical system mirrors which reduce and project a circuit pattern on the mask onto a wafer; and the like. Those usable as the light source include those of the laser plasma system, the discharge plasma system, etc. It is necessary that the optical path for the exposure light should be in vacuum in order to suppress the absorption of the light. The groups of mirrors, which constitute the optical systems, are accommodated in a vacuum chamber. Such an EUV exposure apparatus is described, for example, in International Publication No. 2007/004358.

In the conventional exposure apparatus which uses the ultraviolet light as the exposure light, the projection optical system thereof is the transmission dioptric system, which is the rotationally symmetrical optical system about the center of the optical axis. Therefore, all of the optical elements including the pupil (or the aperture diaphragm) are rotationally symmetrical. The aperture diaphragm necessarily has the optimum shape which is circular and which is parallel to the reticle surface and the wafer surface. Such a circular aperture diaphragm has been hitherto used.

On the other hand, in those using the catoptric optical system as the projection optical system such as the EUV exposure apparatus described in International Publication No. 2007/004358, a field which is separated (away) from the optical axis is used in order to avoid the light flux interference. However, an aperture diaphragm, which is circular or elliptical, is arranged in parallel to the reticle surface and the wafer surface at a position at which the light flux is allowed to pass obliquely with respect to the optical axis.

However, such an aperture diaphragm is not provided at an optimum position in relation to respective orientations in the field. For this reason, it is feared that the deterioration of the optical performance, which includes the distortion of the image, etc. might be caused when the image is projected onto the wafer.

SUMMARY OF THE INVENTION

The present invention has been made taking the foregoing viewpoints into consideration, an object of which is to provide an optical system which is excellent in the optical performance and an aperture diaphragm which is preferably usable for such an optical system. Another object of the present invention is to provide an exposure apparatus which uses the optical system or the aperture diaphragm and a method for producing an electronic device.

According to a first aspect of the present invention, there is provided an optical system comprising an aperture diaphragm which defines a light flux on a predetermined plane; wherein a contour of an aperture shape of the aperture diaphragm has a three-dimensional shape.

According to a second aspect of the present invention, there is provided an optical system comprising at least two reflecting optical elements; wherein the optical system has a pupil plane in an optical path between the two reflecting optical elements; and a contour of the pupil plane has a three-dimensional shape.

According to a third aspect of the present invention, there is provided an aperture diaphragm restricting a light flux which comes into an optical system or which exits from the optical system, the aperture diaphragm comprising a member which has an inner circumferential portion defining an aperture; wherein the inner circumferential portion of the member exists on a curved surface formed such that a plane, which intersects a main light (main light beam) of the light flux, is partially warped in a direction of the main light beam.

According to a fourth aspect of the present invention, there is provided an exposure apparatus comprising the optical system or the aperture diaphragm of the present invention.

According to a fifth aspect of the present invention, there is provided a method for producing an electronic device, including a lithography step; wherein the exposure apparatus according to the present invention is used in the lithography step.

According to the optical system concerning the first aspect of the present invention, the contour of the aperture formed by the aperture diaphragm has the three-dimensional shape. Therefore, the optical system can be adapted more appropriately to the actual pupil shape of the optical system, and thus it is possible to provide the optical system which is excellent in the optical performance.

According to the optical system concerning the second aspect of the present invention, the contour of the pupil plane of the optical system can be allowed to have the three-dimensional shape. Thus, it is possible to provide the optical system which is excellent in the optical performance.

According to the exposure apparatus concerning the present invention, a finer pattern can be formed more accurately, because the optical system or the aperture diaphragm of the present invention is used.

According to the method for producing the electronic device concerning the present invention, a small-sized electronic device, which is highly integrated, can be produced as well, because the exposure apparatus according to the present invention is used.

DESCRIPTION OF THE PREFERRED EMBODIMENTS

At first, an explanation will be made briefly about the problem of the conventional aperture diaphragm of the optical system found out by the present inventors in the way to arrive at the present invention and the approach to solve the problem. It has been found out, with respect to the projection optical system such as the EUV exposure apparatus, that when light beams (lights) which have uniform NA (Numerical Aperture) on the wafer side are traced at respective points in the field, a position at which the optimum pupil is provided in the vicinity of the pupil differs among the directions of the light beams defined by identical NA irrelevant to the coaxial design and the non-coaxial design. In particular, the light beams, which are defined by the same NA and which are allowed to exit from the respective points in the field, do not intersect at a same point in the vicinity of the pupil, and the light beams draw light fluxes having certain minimum circles of confusion. The heights of the minimum circles of confusion differ depending on the directions of the light beams defined by the same NA. In particular, the large distortion is provided in the sagittal direction and the meridional direction of the light beam defined by NA. It is not merely that an ellipse is drawn on a plane or that a curved line is drawn on a plane which is not parallel to the reticle surface and the wafer surface; but that the envelope curve, which is obtained by connecting, in the respective directions of the light beams defined by NA, the heights of the minimum circles of confusion of the light fluxes formed by the light beams allowed to pass through a plurality of optical paths (directions) defined by the same NA in relation to the respective points in the field, is not present on a same plane. It has been revealed that this tendency arises irrelevant to the fact that the optical design is coaxial or non-coaxial. The asymmetry is rather enhanced in the case of the non-coaxial design or in the case of the optical system having large NA.

Figure 30:
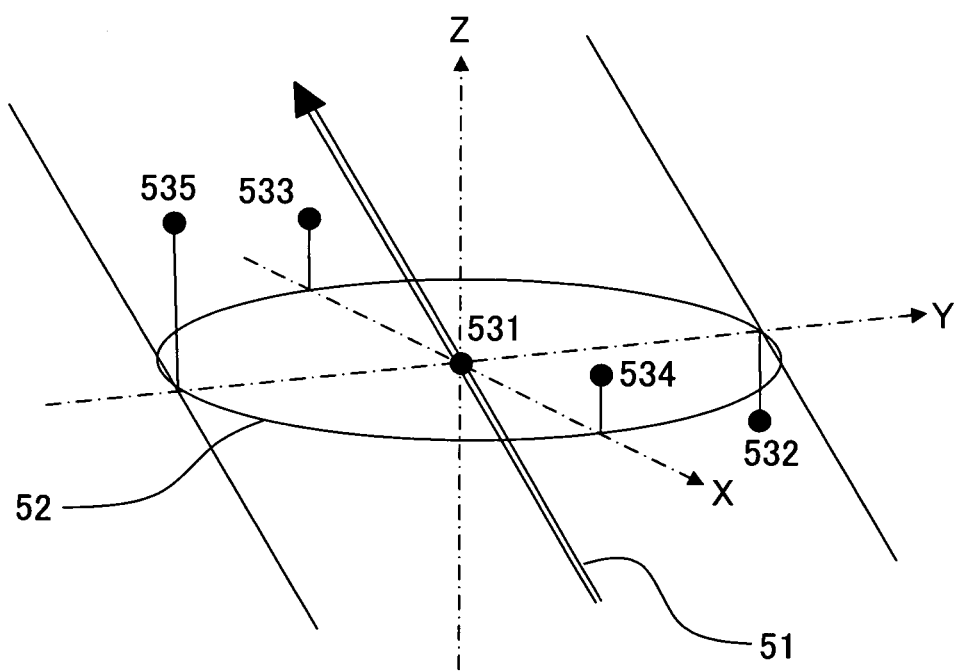
FIG. 30 shows a perspective view to explain a situation that the optimum pupil shape is a three-dimensional shape.

This situation will be explained with reference to FIG. 30. FIG. 30 schematically shows a projection optical system, of an EUV exposure apparatus, at a portion thereof in the vicinity of the pupil. In the projection optical system illustrated in FIG. 30, the light flux is allowed to pass through the pupil from the lower position to the upper position. In this case, as for the X, Y, and Z axes, the Z axis is the vertical direction or the upward-downward direction wherein the upper position is located on the side on which the reticle exists, the X axis is the non-scanning direction, and the Y axis is the scanning direction. Although not shown, the projection optical system is designed with six pieces by way of example. It is assumed that six mirrors of M1, M2, M3, M4, M5, and M6 are provided along an optical sequence directed from the reticle to the wafer; and it is assumed that the pupil of the projection optical system exists between the M1 mirror and the M2 mirror. In this case, the light beam (light), which comes from the reticle, is reflected by the M1 mirror, and the light flux is directed toward the M2 mirror disposed upwardly as compared with the M1 mirror. Therefore, the light flux passes through the pupil from the lower position to the upper position. It is a matter of course that the pupil does not necessarily exist between the M1 mirror and the M2 mirror in the case of a different design solution, and the direction, in which the light flux passes through the pupil, is not necessarily directed from the lower position to the upper position as well.

It is assumed that a main light beam (a chief ray) 51 is a ray or light beam in which NA corresponds to zero, and the representative pupil height is represented by a point 531 at which the light beams exiting from the respective points in the field are most converged in the vicinity of the pupil. The light beams exiting from the respective points in the field are not completely converged to one point due to the characteristic of the optical system, and the minimum circles of confusion are obtained. Conventionally, an aperture diaphragm is constructed in the vicinity of the concerning height so that a circular or elliptical aperture is formed on a plane having a height finely adjusted to provide the optimum optical performance for individual NA corresponding to a predetermined NA value (for example, NA=0.25 or NA=0.20, etc.).

However, the following fact has been found out. That is, when the heights of the minimum circles of confusion, at which the light beams exiting from the respective points in the field are most converged in the vicinity of the pupil, are plotted in the respective orientations in the pupil (in the four directions of the ±X orientations and the ±Y orientations in the pupil) respectively, for example, for the light fluxes of NA=0.25, the heights represented by 532 to 535 are provided respectively. For example, as shown in FIG. 30, when the light flux penetrates while being inclined from +Y to −Y when the main light beam penetrates from the −Z direction to the +Z direction in the vicinity of the pupil, the following fact has been revealed for a certain optical design. That is, the height 532 of the minimum circle of confusion of the light flux of NA=0.25 allowed to pass in the +Y orientation of the pupil is present on the −Z side as compared with the height 531; and the heights 533, 534 of the minimum circles of confusion of the light fluxes of NA=0.25 allowed to pass in the ±X orientations of the pupil are present on the +Z side as compared with the height 531. Further, the height 535 of the minimum circle of confusion of the light flux of NA=0.25 allowed to pass in the −Y orientation of the pupil is present on the +Z side as compared with the height 531, and is disposed at a position further higher than that of the heights 533, 534.

FIG. 30 is illustrative of the exemplary case in which the light flux is allowed to pass while being inclined from the +Y side to the −Y side when the light flux travels from the −Z side to the +Z side, wherein the minimum circle of confusion in the +Y orientation is distorted toward the −Z side, and the minimum circle of confusion in the −Y orientation is distorted toward the +Z side. However, this situation is not necessarily provided for the following reason. That is, for example, the situations differ depending on what distortion is provided in the vicinity of the pupil for every optical design.

As an example, in a simulation for a certain optical system performed by the present inventors, on condition that the height of 531 is the reference height, the height of 532 is −4 mm, the heights of 533 and 354 are +5 mm, and the height of 535 is +10 mm. If the heights of the minimum circles of confusion in the respective orientations of NA=0.25 are aligned on the plane, the height of 532, the heights of 533, 534, and the height of 535 should be aligned at equal intervals.

However, actually, the difference between the height of 532 and the heights of 533, 534 is 9 mm, and the difference between the height of 535 and the heights 533 and 534 is 5 mm. This means the fact that any straight line is not provided but a curved line is depicted when the curved line of the contour, which is obtained by connecting the heights of the minimum circles of confusion in the respective orientations, is projected in the X direction. That is, this means the fact that the contour of the pupil of NA=0.25 is most appropriately a three-dimensional curved line (shape obtained by boring a curved surface).

This means the fact that the optical performance can be rather improved for a reflecting optical system of the EUV exposure apparatus by constructing such an optimum diaphragm shape that the contour of the aperture is not present on a same plane. Any aperture diaphragm as described above has been hitherto absent. In the case of the aperture on the plane parallel to the reticle surface and the wafer surface or the aperture on the plane inclined and not parallel to the reticle surface and the wafer surface as having been hitherto present, it is feared that the optical performance may be partially deteriorated.

As described above, in the case of the conventional technique provided with the aperture diaphragm having the circular or elliptical aperture on the plane parallel to or not parallel to the mask or the wafer, the contour of the aperture exists on the plane. Therefore, the optimum pupil height is not necessarily provided in the respective orientations in the field; and this causes the deterioration of the optical performance, for example, such that the distortion is brought about as if the pupil differs among the respective image heights when the projection is performed onto the wafer. The problem as described above has been dissolved by the present inventors by the optical system of the present invention as illustratively exemplified in the following specified embodiments.

An explanation will be made below with reference to the drawings about the embodiments in which the optical system of the present invention is applied.

Overall Construction of Exposure Apparatus

Figure 1:
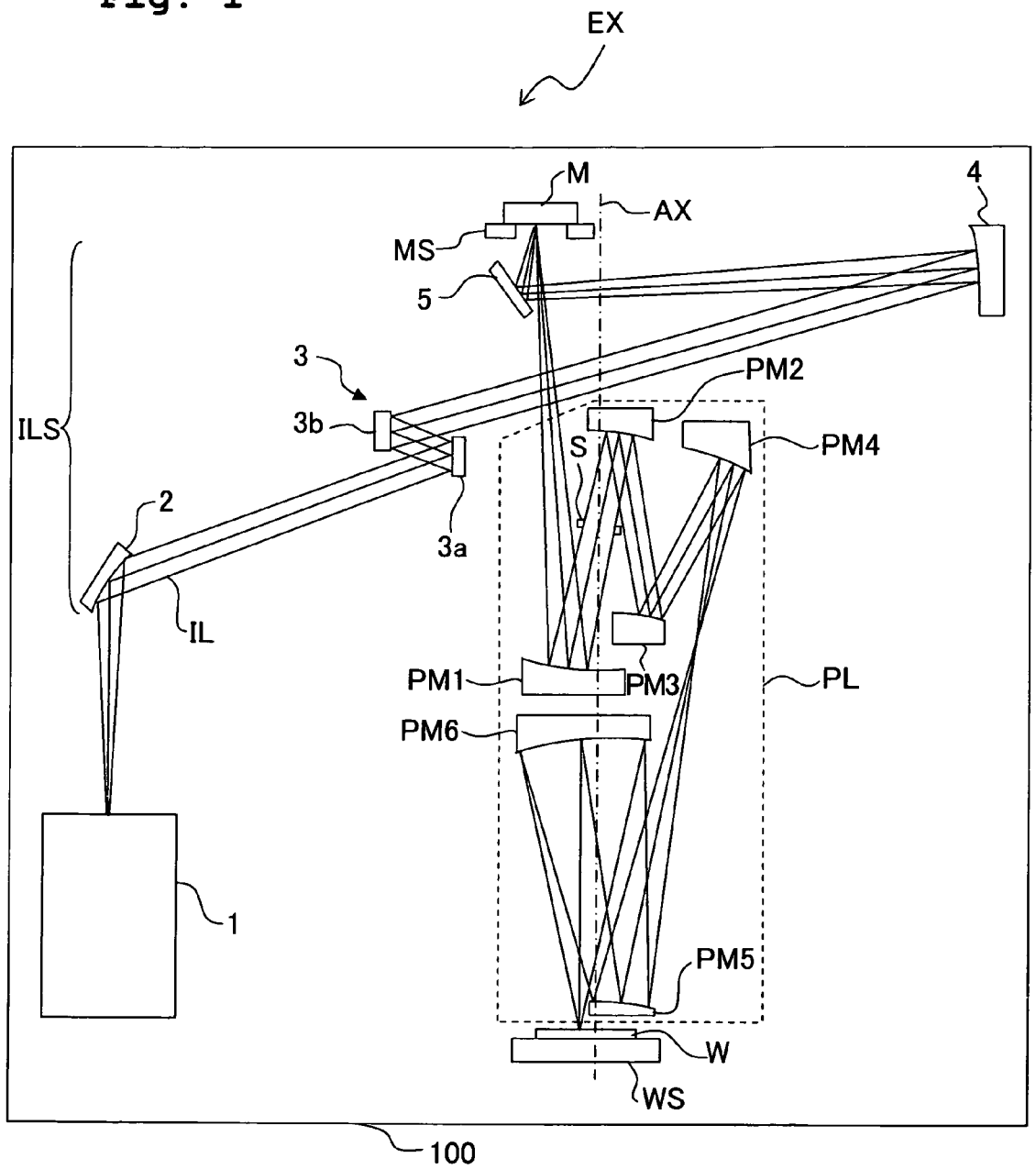
FIG. 1 shows a schematic construction of an EUV exposure apparatus according to an embodiment of the present invention.

FIG. 1 shows an outline of an exposure apparatus EX of this embodiment. The exposure apparatus EX of this embodiment is an EUV exposure apparatus which uses, as the exposure light, the EUV (Extreme Ultra Violet) light as the extreme ultraviolet light having a wavelength of about 5 nm to 100 nm.

The exposure apparatus EX of this embodiment includes an illumination optical system ILS which illuminates a pattern surface (mask surface) of a reflection type mask M with an illumination light (illumination light beam) (exposure light) IL for the exposure from a light source device 1, a mask stage MS which places the mask M thereon and which positions the mask M, a projection optical system (imaging optical system) PL which projects a pattern image of the mask M onto a wafer W (photosensitive substrate), and a wafer stage WS which places the wafer W thereon and which positions the wafer W.

In FIG. 1, the Z direction is the normal line direction of the placing surface for the wafer W, the Y direction is the direction which is parallel to the sheet surface of FIG. 1 in a plane perpendicular to the Z direction, and the X direction is a direction which is perpendicular to the sheet surface. The exposure apparatus EX of this embodiment is a scanning type exposure apparatus wherein the mask pattern on the mask M is projected onto the wafer W while scanning and moving the mask M and the wafer W in the Y direction shown in FIG. 1 (hereinafter referred to as "scanning direction Y" as well).

The exposure apparatus EX of this embodiment has a vacuum chamber 100 which has its interior maintained in a vacuum atmosphere. The entire optical path, which ranges from the light-emitting point of the EUV light to the wafer W, is accommodated in the vacuum chamber 100. An unillustrated mask holder of the electrostatic chuck system is provided on the mask stage MS. The mask M is held by the mask holder. Similarly, an unillustrated wafer holder of the electrostatic chuck system is provided on the wafer stage WS. The wafer W is held by the wafer holder. The mask stage MS and the wafer stage WS can be driven at predetermined strokes in the Y direction by a mask stage driving section (not shown) and a wafer stage driving section (not shown) respectively; and the mask stage MS and the wafer stage WS can be also driven in the X direction, the Z direction, the θX direction which is the direction of rotation about the X direction, the θY direction which is the direction of rotation about the Y direction, and the θZ direction which is the direction of rotation about the Z direction.

An unillustrated controller or control section is arranged. Various instructions are given from the controller to respective parts of the exposure apparatus of this embodiment including the mask stage MS, the wafer stage WS, etc. The exposure light, which is radiated from the light source device 1 such as a laser excitation type plasma light source or a discharge excitation type plasma light source, is converted into a substantially parallel light flux by a collimator mirror 2, and the exposure light is allowed to come into the illumination optical system ILS.

The exposure light (illumination light IL), which is allowed to come into the illumination optical system ILS, comes into an optical integrator 3. That is, the illumination light IL is successively reflected by a first fly's eye mirror 3a (first uniformizing optical element) and a second fly's eye mirror 3b (second uniformizing optical element) which constitute the optical integrator 3 of the reflection type; and a substantial surface light source, which has a predetermined shape, is formed on the pupil plane (illumination optical system pupil plane) of the illumination optical system ILS disposed on the second fly's eye mirror 3b (or in the vicinity thereof). After that, the illumination light IL is collected by a condenser mirror 4; and the illumination light IL is deflected by a plane mirror 5 for bending the optical path. The inside of the exposure field on the pattern surface of the mask M is illuminated substantially uniformly with the illumination light IL having a circular arc slit-shaped form.

The illumination light IL (exposure light), which is reflected by the pattern surface of the mask M and which is allowed to come into the projection optical system PL, is reflected by a first mirror PM1; and the illumination light IL (exposure light) is allowed to travel via an aperture diaphragm S which is arranged on the pupil plane of the projection optical system PL or in the vicinity thereof. After that, the illumination light IL (exposure light) comes into a second mirror PM2. The illumination light IL (exposure light), which is reflected by the second mirror PM2, is successively reflected by a third mirror PM3, a fourth mirror PM4, a fifth mirror PM5, and a sixth mirror PM6 to form the image of the mask pattern in the exposure area on the wafer W.

The respective mirrors PM1 to PM6, which constitute the projection optical system PL, are the reflection type optical elements each of which has a multilayer film constructed of at least two materials stacked with each other on a surface of a mirror substrate made of low thermal expansion glass. Those usable as the multilayer film include one which is constructed, for example, such that molybdenum (Mo) and silicon (Si) having reflection peaks at a wavelength of 13.5 nm are alternately stacked to provide about 40 to 50 layers. Note that the mirrors constructing the illumination optical system ILS, etc. are also constructed in the same manner as described above.

The projection optical system PL of this embodiment is the coaxial catoptric optical system which is axially symmetrical in relation to an optical axis AX as shown in FIG. 1. In such an optical system, the light flux, which travels from the mask M to arrive at the wafer W, is successively reflected by the plurality of mirrors (first mirror PM1 to sixth mirror PM6); and the respective optical paths thereof are spatially overlapped with each other to a considerable degree, and the light flux travels reciprocatively among the respective mirrors. In order to avoid the shielding caused by the circular mirror (for example, the second mirror) which is arranged on the optical axis and which is included in the mirrors constructing the projection optical system PL, the shape of the field thereof is generally a part of a circular arc-shaped area separated (away) by a predetermined radius from the optical axis on the object plane and the image plane.

In the projection optical system PL of this embodiment, the field thereof is a circular arc-shaped area having, as the center thereof, a position separated from the optical axis AX in the +Y direction as the third direction on the object plane (mask M). Further, the projection optical system PL is the optical system which is symmetrical in relation to the optical axis. Therefore, the respective light fluxes, which are reflected by the respective mirrors (first mirror PM1 to sixth mirror PM6), are reflected in the converging direction about the center of the optical axis AX or in the diverging direction about the center of the optical axis AX.

The aperture diaphragm (NA diaphragm) S is provided on the predetermined plane (pupil plane of the projection optical system PL or the plane or surface disposed in the vicinity thereof) in the optical path disposed between the first mirror PM1 and the second mirror PM2. The aperture diaphragm S defines NA for the light flux passing through the pupil of the projection optical system PL. The aperture diaphragm S will be explained in detail below.

First Embodiment

Figure 2:
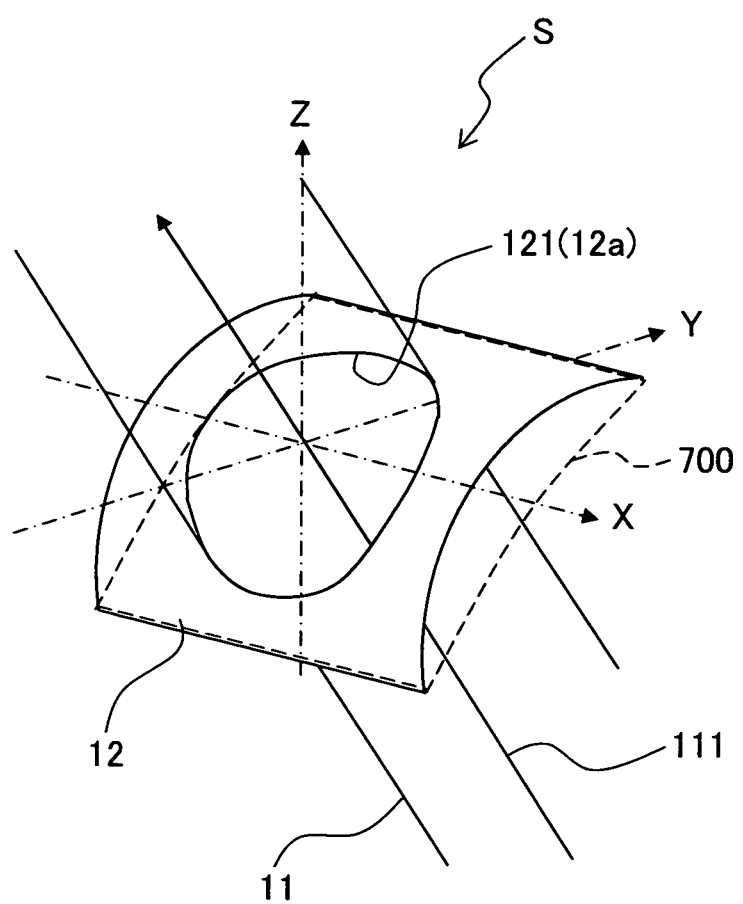
FIG. 2 shows a perspective view of the construction of an aperture diaphragm according to a first embodiment of the present invention.
Figure 3:
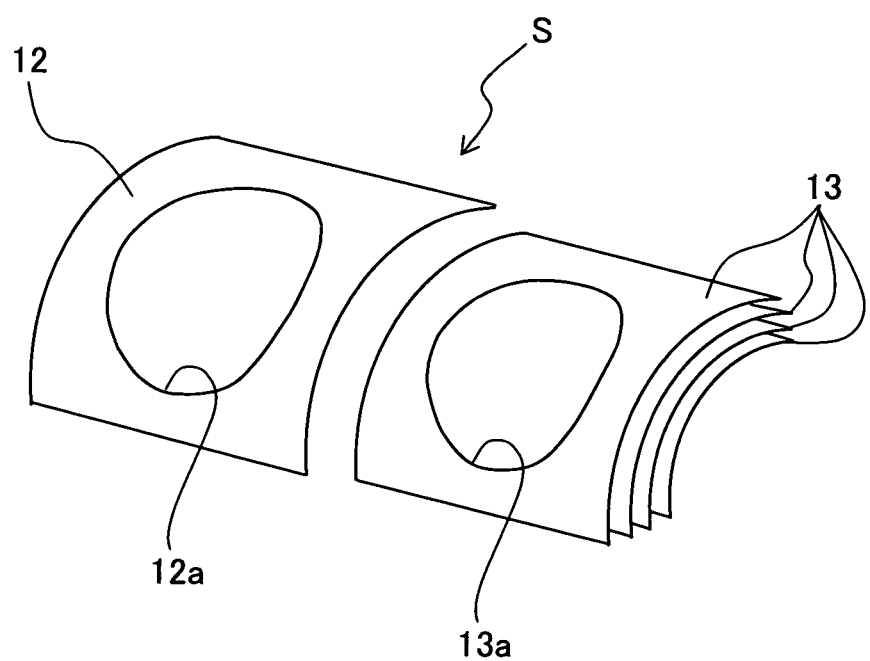
FIG. 3 shows a perspective view of the construction of the aperture diaphragm provided with a plurality of aperture diaphragm plates in the first embodiment of the present invention.

FIG. 2 shows a perspective view of the structure and the arrangement of the aperture diaphragm (NA diaphragm) according to a first embodiment of the present invention. FIG. 3 shows a perspective view of the structure of aperture diaphragm plates as well. The following assumption is affirmed in FIG. 2. That is, the Z axis extends in the optical axis direction (vertical direction when the projection optical system is placed vertically), the XY plane is a horizontal surface, the Y axis extends in the scanning direction, the X axis extends in the non-scanning direction, and the optical system is designed symmetrically in relation to the Y axis.

The aperture diaphragm S of this embodiment is constructed to include an aperture diaphragm plate 12. The aperture diaphragm plate 12 is constructed by providing an aperture 12a, having a predetermined shape, for example, an elliptical shape, for a plate-shaped member previously curved to provide a predetermined curved surface (three-dimensional curved surface). An aperture having a predetermined shape may be formed for a plate-shaped member, and then the plate-shaped member may be curved to provide a predetermined curved surface (three-dimensional curved surface). Therefore, the aperture 12a of the aperture diaphragm plate 12 does not exist on one two-dimensional plane, but the aperture 12a is formed on the three-dimensional curved surface. The contour 121 of the aperture 12a (or the inner circumferential portion defining the aperture 12a) has a three-dimensional shape (three-dimensional curved line). As shown in FIG. 2, a main light beam 111 of the light flux 11 restricted by the aperture diaphragm 12 is inclined by a predetermined angle with respect to the Z axis. The aperture diaphragm plate 12 and the inner circumferential portion 121 which defines the aperture 12a do not exist in a plane intersecting the main light beam, for example, a plane or surface 700 depicted by imaginary lines in FIG. 2, but the aperture diaphragm plate 12 and the inner circumferential portion 121 exist on a curved surface formed by partially warping the plane 700 in the direction of the main light beam. That is, the sites or the points in the circumferential direction, which constitute the inner circumferential portion 121, are offset in the direction of the main light beam from the plane 700 which intersects the main light beam. The distance of the offset (optimum pupil height) differs depending on the in-plane orientation of the plane 700. The material of the aperture diaphragm plate 12 is formed of, as an example, stainless steel. It is desirable to use, for example, a metal having a high coefficient of thermal conductivity as the material of the aperture diaphragm plate 12. The three-dimensional shape, which is referred to in this embodiment, refers to, for example, the steric or three-dimensional shape, which includes at least straight lines or curved lines depicted on two planes. The pupil or the pupil plane, which is referred to in this embodiment, includes the area in which the respective minimum circles of confusion are formed as described above or the plane which is in contact with the area.

The three-dimensional shape (three-dimensional curved line), which relates to the contour 121 of the aperture of the aperture diaphragm plate 12, is obtained by connecting the optimum pupil heights in the respective orientations previously calculated by the ray tracing depending on the NA value defined by the aperture diaphragm plate 12. In this embodiment, the aperture diaphragm plate 12 is symmetrical, for example, in relation to the Y axis. The aperture diaphragm plate 12 is bent or warped in the Y axis direction along the two-dimensional curved line obtained by projecting, onto the X-Z plane, the three-dimensional curved line obtained by connecting the optimum pupil heights in the respective orientations. Therefore, in this embodiment, the contour of the pupil has the three-dimensional shape.

The aperture diaphragm plate 12 is fixedly provided, for example, on a mirror barrel or a frame constructing the projection optical system PL, in a case that the projection optical system PL on which the aperture diaphragm plate 12 is provided or arranged is of such a type that NA is not changed.

In a case that the projection optical system PL is of such a type that NA is changeable, the following construction or arrangement is available corresponding thereto. That is, as shown in FIG. 3, for example, a plurality of aperture diaphragm plates 13, which have mutually different contours of three-dimensional shapes respectively, are provided depending on the number of sizes of NA to be changed, in addition to the aperture diaphragm plate 12, so that at least one of the plurality of aperture diaphragm plates 13 and the aperture diaphragm plate 12 may be arranged selectively and exchangeably in the optical path for the light flux 11.

Figure 4:
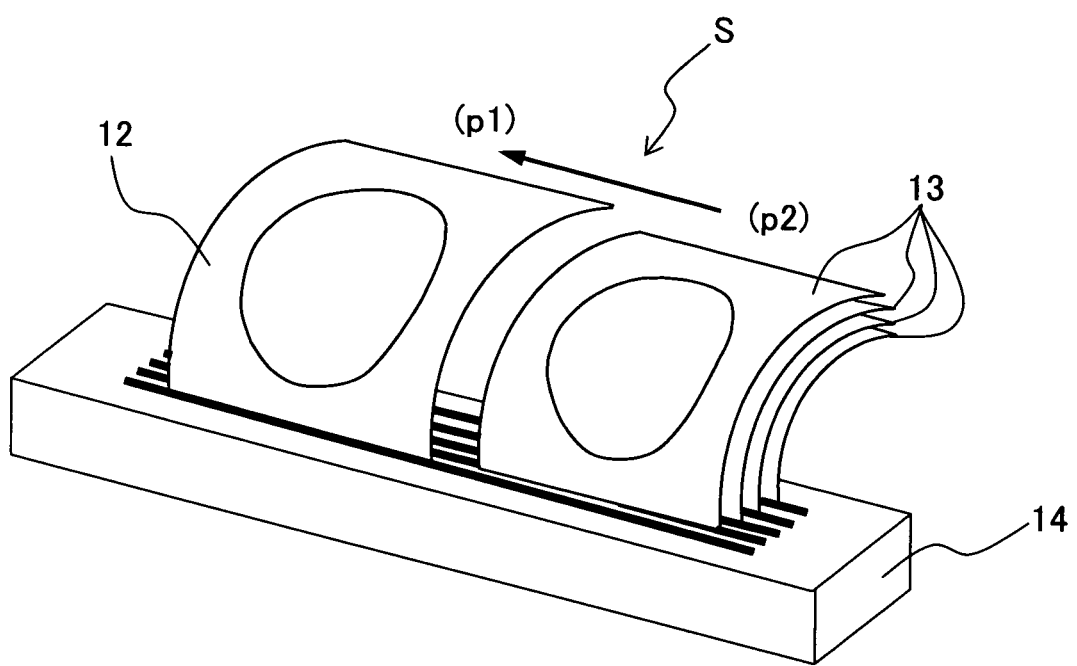
FIG. 4 shows a perspective view of the construction of an aperture diaphragm provided with a driving device in the first embodiment of the present invention.

It is of course allowable that the aperture diaphragm plates 12, 13 are exchanged manually. However, as shown in FIG. 4, it is desirable that the exchange is performed automatically as follows. That is, the plurality of aperture diaphragm plates 12, 13 are each held to be movable back and forth (slidable) in the X axis direction. Further, a driving device (driving section) 14 is provided, which moves each of the aperture diaphragm plates 12, 13 back and forth between a position (insertion position or advance position) p1 which is located in the optical path for the light flux 11 and a position (retraction position) p2 at which each of the aperture diaphragm plates 12, 13 is retracted from the optical path. Those usable as the driving device 14 include, for example, those constructed of stepping motors and racks and pinions as well as actuators such as linear motors.

The plurality of aperture diaphragm plates 12, 13 are arranged in a stacked manner while shifting or deviating the positions thereof little by little toward the upstream side, with respect to the traveling direction of the light flux 11, in an order from those having the large sizes of the apertures 12a, 13a to those having the small sizes of the apertures 12a, 13a, for the following reason. That is, it is intended to avoid any mutual interference during the back and forth movement. Further, the consideration is made for such a tendency that the optimum pupil position is moved to the upstream side with respect to the traveling direction of the light flux 11 as a whole as the size of NA is decreased. The optimum pupil position is moved to the downstream side with respect to the traveling direction of the light flux 11 in some cases depending on the optical system. In such a situation, the plurality of aperture diaphragm plates 12, 13 are arranged with the positions thereof be shifted little by little toward the downstream side with respect to the traveling direction of the light flux 11 in an order from those having the large sizes of the apertures 12a, 13a to those having the small sizes of the apertures 12a, 13a.

It is not necessarily indispensable that a aperture diaphragm plate (in FIG. 3, the aperture diaphragm plate 12), which is included in the plurality of aperture diaphragm plates 12, 13 and which has the maximum NA, should be moved back and forth. Therefore, the aperture diaphragm plate 12 may be provided fixedly, and the other aperture diaphragm plates 13 may be driven and moved back and forth. When an aperture diaphragm plate 13, which corresponds to the smaller NA, is inserted into the optical path for the light flux 11, the aperture diaphragm plates 12, 13, which correspond to the larger NA's, may remain while being inserted into the optical path for the light flux 11.

In the projection optical system PL in this embodiment, the contour 121 of the aperture shape of the aperture diaphragm plate 12 defining NA has the three-dimensional shape adapted to the actual pupil shape of the projection optical system PL. Therefore, the projection optical system PL of this embodiment is excellent in the optical performance.

In a case that NA is changed, then the three-dimensional curved lines which have the optimum aperture contours are calculated corresponding to the respective NA values, in the same manner as described above, to prepare the aperture diaphragm plates 12, 13 having the apertures concerning the three-dimensional shapes corresponding thereto respectively, and the aperture diaphragm plates 12, 13 are slidably driven manually or by using the driving device 14. Therefore, it is possible to provide the optimum aperture shape concerning the three-dimensional shape corresponding to each of NA's.

Second Embodiment

Figure 5:
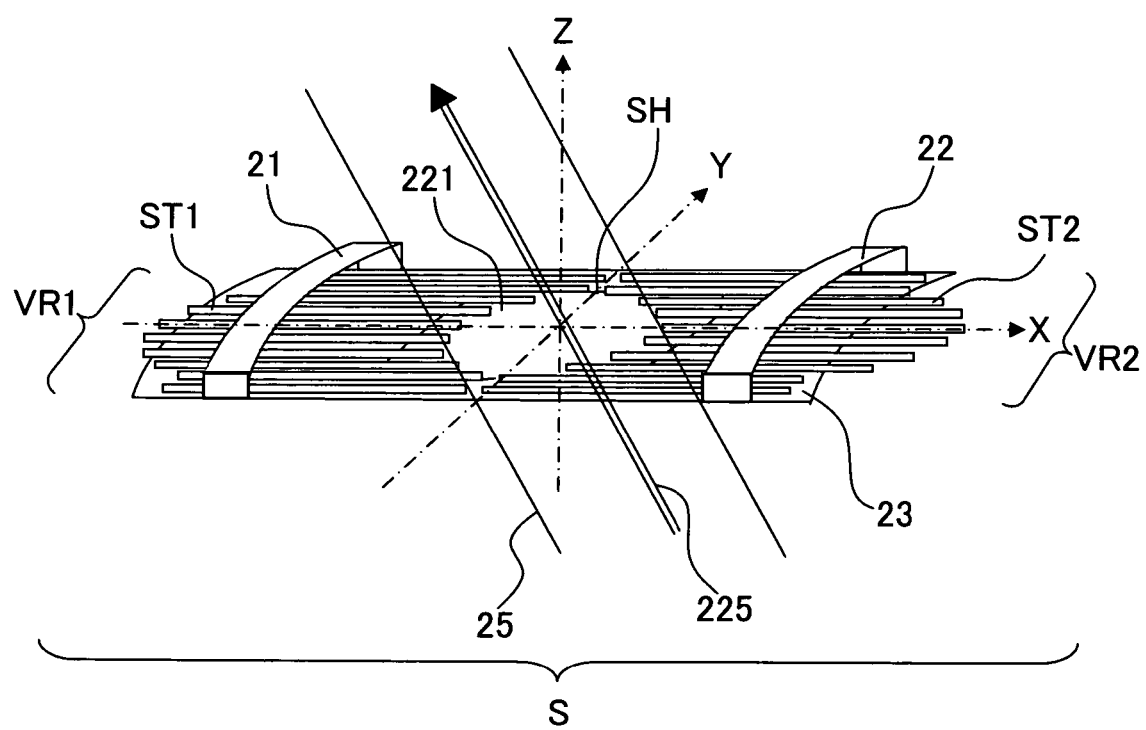
FIG. 5 shows a perspective view of an example of an aperture diaphragm in a second embodiment of the present invention.
Figure 6:
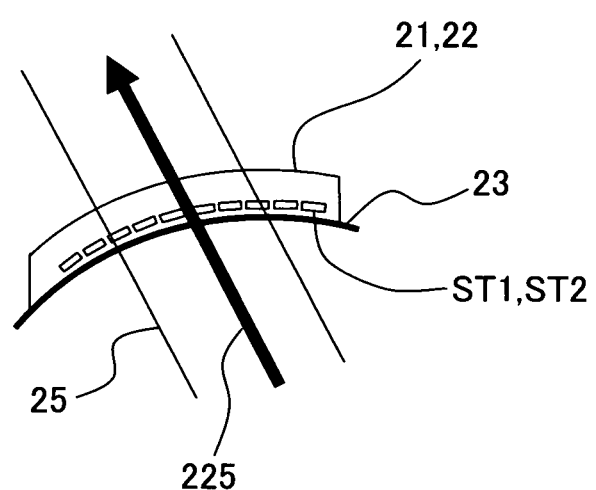
FIG. 6 shows a side view of the example of the aperture diaphragm in the second embodiment of the present invention.
Figure 7:
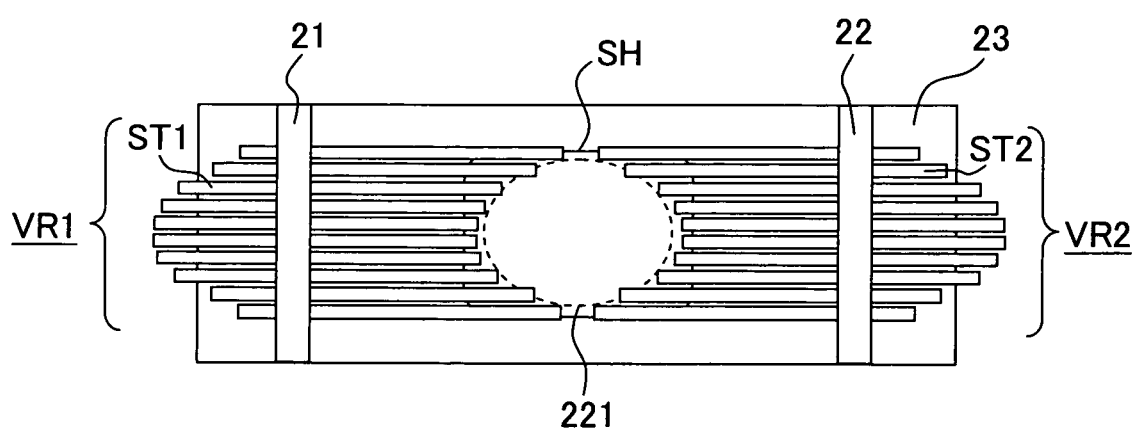
FIG. 7 shows a top view of the example of the aperture diaphragm in the second embodiment of the present invention.
Figure 7:
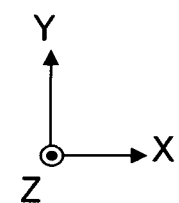

FIG. 5 shows a perspective view of the construction of an aperture diaphragm (NA diaphragm) according to a second embodiment of the present invention. FIG. 6 shows a side view of the same, and FIG. 7 shows a top view of the same. The aperture diaphragm S of this embodiment is provided as a variable aperture diaphragm of such a type that a plurality of first strip members ST1 and a plurality of second strip members ST2 are inserted in the ±X directions respectively with respect to the light flux 25 including a main light beam 225 passing through the pupil so as to form the contour of the aperture.

In the aperture diaphragm S of this embodiment, as shown in FIGS. 5 and 6, the plurality of (ten in FIGS. 5 and 6) first strip members ST1 (example of the first light shielding member) constructing a first variable light shielding member VR1 and the plurality of (ten in FIGS. 5 and 6) second strip members ST2 (example of the second light shielding member) constructing a second variable light shielding member VR2 are arranged on the pupil plane of the projection optical system PL or in the vicinity of the pupil plane. In this case, the first variable light shielding member VR1 has the plurality of first strip members ST1, and at least a part (first portion) of the contour of the aperture shape (or the inner circumferential portion of the aperture) is defined by the plurality of first strip members ST1. Similarly, the second variable light shielding member VR2 has the plurality of second strip members ST2, and at least a part (second portion) of the contour of the aperture shape (or the inner circumferential portion of the aperture) is defined by the plurality of second strip members ST2.

The first strip members ST1 are elongated or lengthy flat plates. Ends in the longitudinal direction of the first strip members ST1 are arranged while being directed toward the aperture portion SH of the aperture diaphragm S; and the ends in the longitudinal direction form at least the part (first portion) of the contour of the aperture shape in this construction. The longitudinal direction of the plurality of first strip members ST1 is substantially parallel to the first direction (X direction as shown in FIG. 5), and the plurality of first strip members ST1 are arranged closely to one another in the transverse direction or short direction (Y direction as shown in FIG. 5).

Similarly, the second strip members ST2 described above are also elongated or lengthy flat plates. Ends in the longitudinal direction of the second strip members ST2 are arranged while being directed toward the aperture portion SH of the aperture diaphragm S at the positions different from those of the first strip members ST1; and the ends in the longitudinal direction form at least the part (second portion) of the contour of the aperture shape in this construction. The longitudinal direction of the plurality of second strip members ST2 is substantially parallel to the second direction (X direction as shown in FIG. 5), and the plurality of second strip members ST2 are arranged closely to one another in the transverse direction (Y direction as shown in FIG. 5).

The first strip members ST1 and the second strip members ST2 are held movably back and forth (slidably) along a holding portion 23 formed of a plate-shaped member. As shown in FIG. 6, the holding portion 23 is curved so that a predetermined curved surface (three-dimensional curved surface) is provided as viewed in the X axis direction. Therefore, by moving the first strip members ST1 and the second strip members ST2 back and forth, the contour 221 of the aperture is formed along the curved surface shape as well. The contour 221 of the aperture is a three-dimensional curved line previously obtained by connecting the optimum pupil heights in the respective orientations calculated by the ray tracing depending on the NA value. The holding portion 23 is constructed so that the first strip members ST1 and the second strip members ST2 are arranged (aligned) along a two-dimensional curved line obtained by projecting the three-dimensional curved line onto the X-Z plane. In this embodiment, it is not necessarily indispensable that the holding portion 23 should be curved as described above. It is also allowable that the holding portion 23 is absent.

Further, as shown in FIGS. 5 and 6, a driving device (first driving section) 21, which slidably drives the first strip members ST1 in the longitudinal direction (first direction), i.e., which drives the first strip members ST1 by pushing or pulling the first strip members ST1, is connected to the first strip members ST1 respectively. Therefore, in the projection optical system PL of this embodiment, the first strip members ST1 are slidably driven in the longitudinal direction via the driving device 21, and thus a part (left half as shown in FIG. 5) of the shape of the aperture (aperture portion SH) of the aperture diaphragm S can be changed continuously or in a stepwise manner.

Similarly, as shown in FIGS. 5 and 6, a driving device (third driving section) 22, which slidably drives the second strip members ST2 in the longitudinal direction (second direction), i.e., which drives the second strip members ST2 by pushing or pulling the second strip members ST2, is connected to the second strip members ST2 respectively. Therefore, in the projection optical system PL of this embodiment, the second strip members ST2 are slidably driven in the longitudinal direction via the driving device 22, and thus a portion (right half as shown in FIG. 5) of the shape of the aperture (aperture portion SH) of the aperture diaphragm S, which is different from the portion defined by the plurality of first strip members ST1, can be changed continuously or in a stepwise manner.

As described above, by moving the plurality of first strip members ST1 and the plurality of second strip members ST2 back and forth with respect to the light flux 25 respectively, it is possible to form the aperture having an arbitrary size on the three-dimensional curved surface following the holding portion 23, by the end edges of the first strip members ST1 and the second strip members ST2.

In FIGS. 5 and 6, ten pieces of the first strip members ST1 and ten pieces of the second strip members ST2 are depicted for the convenience of illustration. However, for example, it is assumed that the maximum NA is 0.25 and the variable pitch size of NA is 0.01. On this assumption, the numbers of the first strip members ST1 and the second strip members ST2 are fifty respectively, and the number of the both is one hundred.

In this embodiment, the first direction is the X direction as viewed in FIG. 5. However, it is not necessarily indispensable that the first direction should be this direction. For example, the first direction may be the Y direction as viewed in FIG. 5. It is appropriate that the first direction is set in a direction which is suitable to avoid any mechanical interference with the mirror constructing the optical system (and the lens when the optical system includes the lens) as well as the holding member thereof. Similarly, in this embodiment, the second direction is the X direction as viewed in FIG. 5. However, it is not necessarily indispensable that the second direction should be the direction perpendicular to the optical axis AX. The second direction may be the Y direction as viewed in FIG. 5. It is appropriate that the second direction is set in a direction which is suitable to avoid any mechanical interference with the mirror constructing the optical system (and the lens when the optical system includes the lens) as well as the holding member thereof.

As described above, the aperture diaphragm S of this embodiment is constructed such that the aperture shape thereof can be formed by the plurality of first strip members ST1 and the plurality of second strip members ST2 which are movable back and forth along the predetermined three-dimensional curved surface defined by the holding portion 23. Therefore, the aperture, which relates to the three-dimensional shape corresponding to the optimum pupil shape of the projection optical system PL, can be formed depending on NA which is set arbitrarily or in a stepwise manner.

Figure 8:
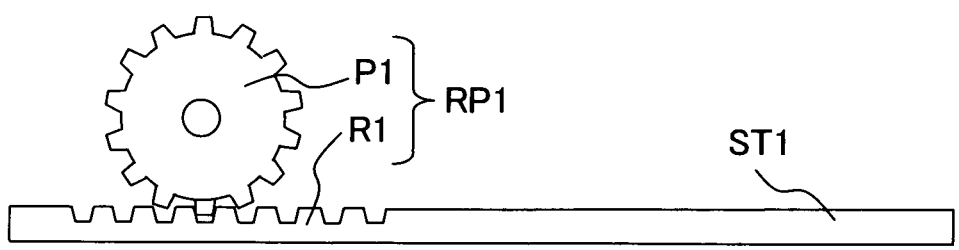
FIG. 8 shows a sectional view of an example of a driving device for sliding a strip member which defines the aperture shape of the aperture diaphragm in the second embodiment of the present invention.
Figure 8:
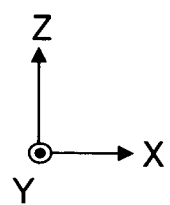

The driving device 21 described above is constructed such that each of the plurality of first strip members ST1 is allowed to slide respectively by, for example, a mechanism RP1 constructed of a rack and pinion, etc. as shown in FIG. 8 connected to each of the plurality of first strip members ST1. The first driving section 21 may be constructed such that the first driving section 21 has an actuator constructed of a linear motor connected to each of the plurality of first strip members ST1, instead of the mechanism RP1 constructed of the rack and pinion or the like, and that the first driving section 21 allows each of the plurality of first strip members ST1 to slide by the motive power from the actuator.

As an example of the driving section 21 described above, the first strip members ST1 have been explained by way of example. However, as shown in FIGS. 5, 6, and 7, the construction, which is the same as or equivalent to that of the first strip members ST1, can be adopted for the driving device 22 which drives the second strip members ST2 as well.

The driving device 21 described above is constructed such that the driving device 21 is driven by a predetermined amount based on a control signal from the unillustrated controller or control section so that the plurality of first strip members ST1 can form at least the part (first portion) of the contour of the aperture shape concerning the three-dimensional shape of the aperture diaphragm S. Further, the driving device 22 described above is constructed such that the driving device 22 is driven by a predetermined amount based on a control signal from the unillustrated controller or control section so that the plurality of second strip members ST2 can form at least the part (second portion) of the contour of the aperture shape concerning the three-dimensional shape of the aperture diaphragm S.

In this way, the aperture diaphragm S of this embodiment is constructed so that the aperture shape concerning the three-dimensional shape thereof can be formed by the plurality of first strip members ST1 and the plurality of second strip members ST2. Further, the aperture diaphragm S is constructed so that the plurality of first strip members ST1 are allowed to slide independently respectively by the driving device 21, and the plurality of second strip members ST2 are allowed to slide independently respectively by the driving device 22. Accordingly, it is possible to finely adjust the numerical aperture NA of the projection optical system PL with ease.

It is desirable that the aperture, which relates to the three-dimensional shape of the aperture diaphragm S of the optical system, has a smooth shape in view of the imaging performance of the optical system.

Figure 9:
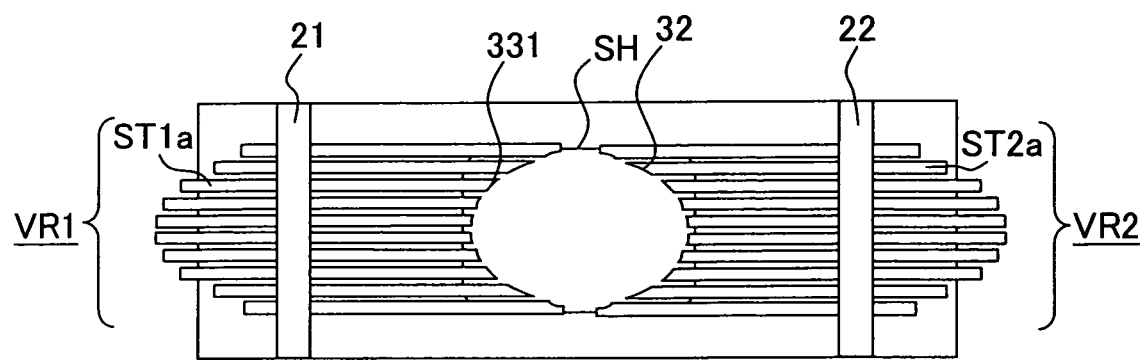
FIG. 9 shows a modification of strip members in the second embodiment of the present invention.
Figure 9:
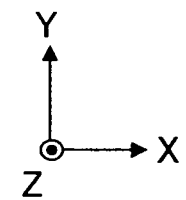

Accordingly, as shown in FIG. 9, it is desirable for the first strip members ST1 of this embodiment that at least the shapes of end portions 331, which are disposed on the side of the aperture portion SH in the longitudinal direction, are inclined line shapes or curved line shapes to be along the optimum pupil shape of the optical system.

FIG. 9 shows a plan view of an example of the shapes of first strip members ST1 *a* in this embodiment. As shown in FIG. 9, the first strip members ST1 *a* have at least the shapes of the end portions 331 disposed on the side of the aperture portion SH in the longitudinal direction, the shapes being the inclined line shapes or the curved line shapes. The shapes of the respective end portions 331 of the plurality of first strip members ST1 *a* are constructed so that the aperture shape of the aperture diaphragm S is formed to be the optimum three-dimensional shape. As described above, in this embodiment, at least the part (first portion) of the aperture shape of the aperture diaphragm S can be formed to be a smoother three-dimensional shape by the plurality of first strip members ST1 *a*. Therefore, it is possible to reduce the setting error of the numerical aperture NA of the projection optical system PL defined by the aperture diaphragm S.

In a case that it is necessary that the aperture shape of the aperture diaphragm S of this embodiment should be approximate to the concerning three-dimensional shape to some extent, it is desirable that the width of the first strip member ST1 in the transverse direction (Y direction in FIGS. 5 and 7) in the foregoing embodiment and the following embodiments is narrow as far as possible within a range in which the production can be performed. By making the width of the first strip member ST1 in the transverse direction to be thinner and by increasing the number of the first strip members ST1 for forming at least the part of the aperture shape of the aperture diaphragm S, it is possible to form, with the plurality of first strip members ST1, at least the part of the aperture shape of the aperture diaphragm S more highly accurately. The width of the first strip member ST1 in the transverse direction is defined in consideration of, for example, the maximum diameter of the aperture diaphragm S of the projection optical system PL, the range in which the numerical aperture NA of the projection optical system PL is variable, the variable step value which is adopted when the numerical aperture NA is variably set, and the number of the first strip members ST1.

For example, in a case that the variable step value of the numerical aperture NA is 0.01 on condition that the range, in which the numerical aperture NA of the projection optical system PL is variable, is 0.1 to 0.5, it is necessary that the width of the first strip member ST1 in the transverse direction should be approximately 2 to 10 mm with respect to the diameter 100 mm of the pupil of the projection optical system PL. Similarly, in a case that the variable step value of the numerical aperture NA is 0.01 on condition that the range, in which the numerical aperture NA of the projection optical system PL is variable, is 0.15 to 0.35, it is necessary that the width of the first strip member ST1 in the transverse direction should be approximately 2.5 to 6.6 mm with respect to the diameter 100 mm of the pupil of the projection optical system PL. Therefore, assuming that the diameter of the pupil of the projection optical system PL is approximately equivalent to the width of the aperture portion SH of the aperture diaphragm S in the direction substantially perpendicular to the first direction (in the transverse direction of the first strip member ST1), then it is necessary that, when the variable step value of the numerical aperture NA is 0.01, the width of the first strip member ST1 in the transverse direction should be approximately 1/50 to 1/10 with respect to the width of the aperture portion SH of the aperture diaphragm S in the direction substantially perpendicular to the first direction.

Further, when the variable step value of the numerical aperture NA is 0.005 on condition that the range, in which the numerical aperture NA of the projection optical system PL is variable, is 0.1 to 0.5, it is necessary that the width of the first strip member ST1 in the transverse direction should be approximately 1 to 5 mm with respect to the diameter 100 mm of the pupil of the projection optical system PL. Therefore, assuming that the diameter of the pupil of the projection optical system PL is approximately equivalent to the width of the aperture portion SH of the aperture diaphragm S in the direction perpendicular to the first direction, then it is necessary that, when the variable step value of the numerical aperture NA is 0.005, the width of the first strip member ST1 in the transverse direction should be approximately 1/100 to 1/20 with respect to the width of the aperture portion SH of the aperture diaphragm S in the direction substantially perpendicular to the first direction.

As described above, as for the number of the first strip members ST1 in this embodiment, it is also possible to increase the number by further thinning the width of the first strip member ST1 in the transverse direction. However, in a case that the necessity for approximating the aperture shape of the aperture diaphragm S to the optimum three-dimensional shape is low, it is also possible that the number of the first strip members ST1 is smaller than the above. By decreasing the number of the first strip members ST1, it is possible to simplify the mechanical construction of the aperture diaphragm S in this embodiment. By decreasing the number of the first strip members ST1 in such a manner, it is also possible to decrease the number of the mechanisms RP1 constructed of the racks, pinions, etc. constructing the first driving section 21, thereby making it possible to obtain an effect such that the generation of dust or chemical pollutant caused by the sliding movement of the first driving section 21 is reduced.

Since the shapes, the number, the widths, etc. of the second strip members ST2 of this embodiment are same as or equivalent to those of the first strip members ST1, ST1a, any explanation of which is omitted.

Next, an explanation will be made about a modification of the first strip member ST1 and the second strip member ST2. Also in this modification, the optical system and the exposure apparatus, in which the first strip members ST1 and the second strip members ST2 are arranged, are constructed in the same manner as in the embodiment described above. In the following description, the constitutive parts or components, which are same as or equivalent to those of the embodiment described above, are designated by the same reference numerals, any explanation of which will be simplified or omitted.

Figure 10:
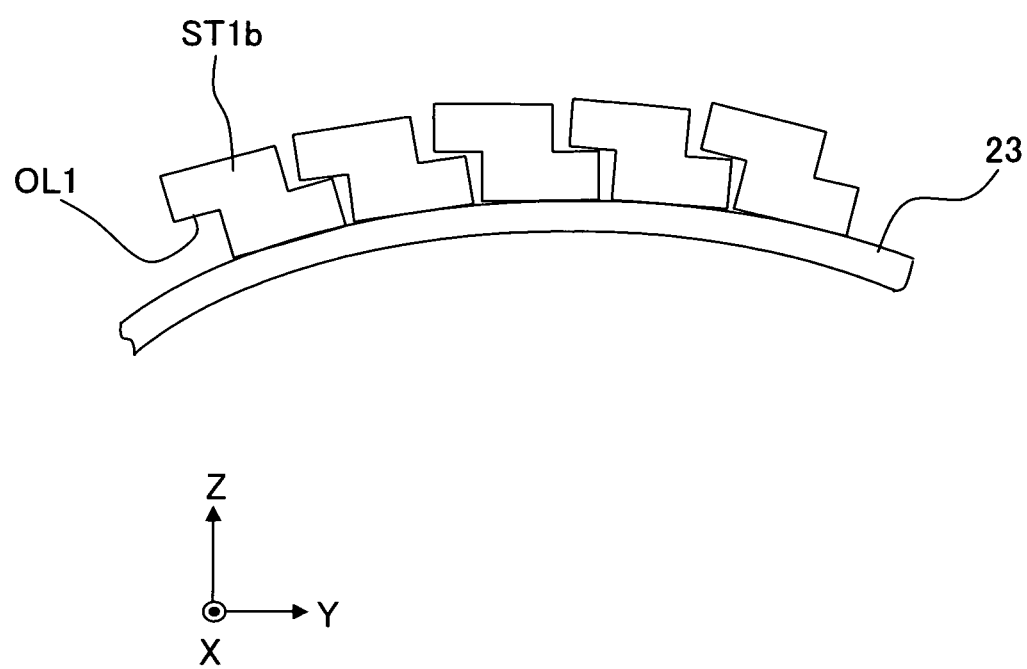
FIG. 10 shows a modification of strip members in the second embodiment of the present invention.

FIG. 10 shows the shapes of first strip members ST1b in this modification. As shown in FIG. 10, the plurality of first strip members ST1b are shaped to have overlapped portions OL1 provided in the longitudinal direction respectively in order that parts thereof are overlapped with each other. The plurality of first strip members ST1b are arranged respectively substantially in parallel to one another so that the mutual overlapped portions OL1 are overlapped with each other. Owing to the construction as described above, it is possible to reduce the leakage of the exposure light from the mutual gaps between the plurality of first strip members ST1b. The shapes of the plurality of first strip members ST1b are not limited to the structure as described above. It is also allowable to adopt any other structure provided that the plurality of first strip members ST1b are constructed so that the leakage can be reduced for the exposure light from the mutual gaps between the plurality of first strip members ST1b. FIG. 10 has been explained as exemplified by the first strip members ST1b by way of example. However, the second strip members ST2b are also constructed in the same manner as the first strip members ST1b.

Figure 11:
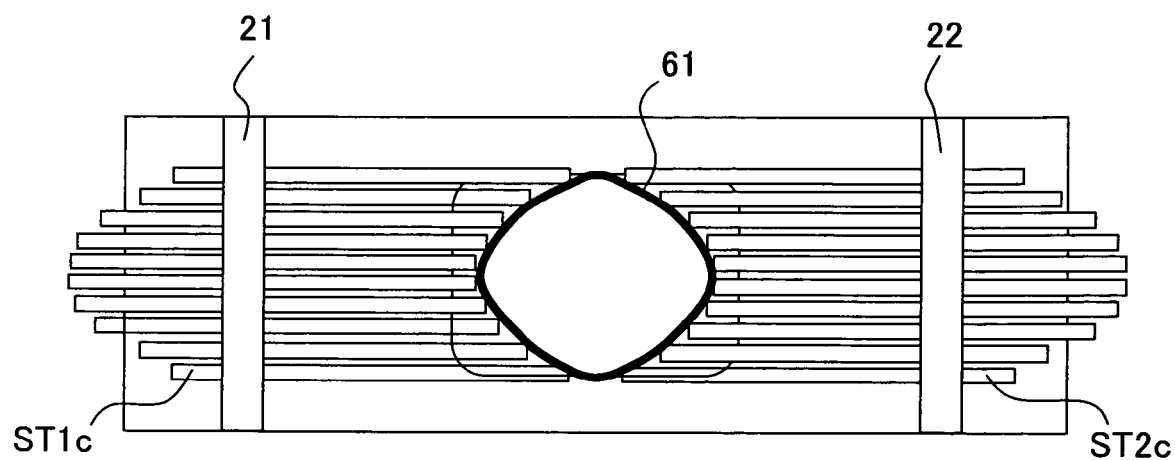
FIG. 11 shows a top view of a modification of the aperture diaphragm in the second embodiment of the present invention.
Figure 12:
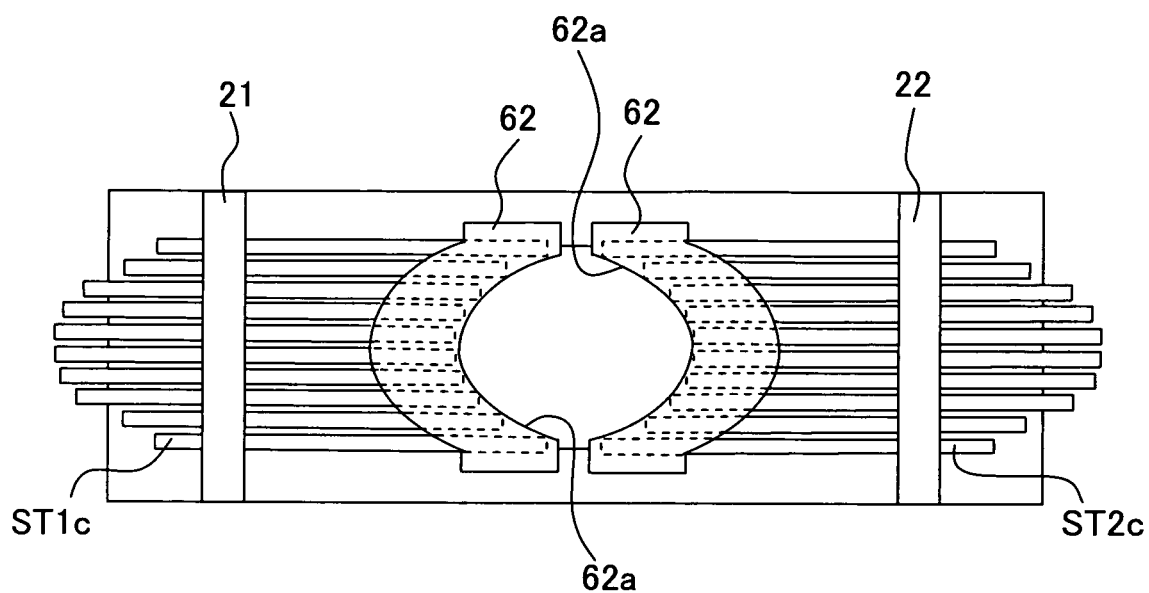
FIG. 12 shows a top view of a modification of the aperture diaphragm in the second embodiment of the present invention.
Figure 12:
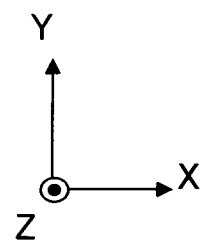

FIGS. 11 and 12 show the shapes of first strip members ST1c in this modification. As shown in FIG. 11, the plurality of first strip members ST1c are constructed such that at least a part or portion of a shape defining member 61 formed with a light shielding film is connected to an end portion of each of the first strip members ST1c in the longitudinal direction. In this construction, the shape defining member 61, which is arranged with respect to the plurality of first strip members ST1c, forms at least a part (first portion) of the aperture shape of the aperture diaphragm S. In particular, an edge or a surface of the shape defining member 61, which is located on the side of the aperture of the aperture diaphragm S, defines the contour or the inner circumferential portion of the aperture. As described above, in this embodiment, at least the part of the aperture shape of the aperture diaphragm S can be formed into a smoother shape by the shape defining member 61 arranged with respect to the plurality of first strip members ST1c.

Alternatively, as shown in FIG. 12, shape defining members 62 may be constructed to have a predetermined width in order to reduce the leakage of the exposure light from the mutual gaps between the plurality of first strip members ST1c. In this case, edges or surfaces 62a of the shape defining members 62, which are located on the side of the aperture, define the contour or the inner circumferential portion of the aperture. Further, each of the shape defining members 61, 62 of this embodiment can be also formed of, for example, an expandable/contractible or flexible resin having a tube-shaped form, etc. FIGS. 11 and 12 have been explained as exemplified by the first strip members ST1c by way of example. However, the second strip members ST2c can be also constructed in the same manner as the first strip members ST1c described above.

Next, a modification of the first driving section 21 will be explained. Also in this modification, the optical system and the exposure apparatus, in which the first strip members ST1 and the second strip members ST2 are arranged, are constructed in the same manner as the embodiment described above. In the following description, the constitutive parts or components, which are the same as or equivalent to those of the embodiment described above, are designated by the same reference numerals, any explanation of which will be simplified or omitted.

Figure 13:
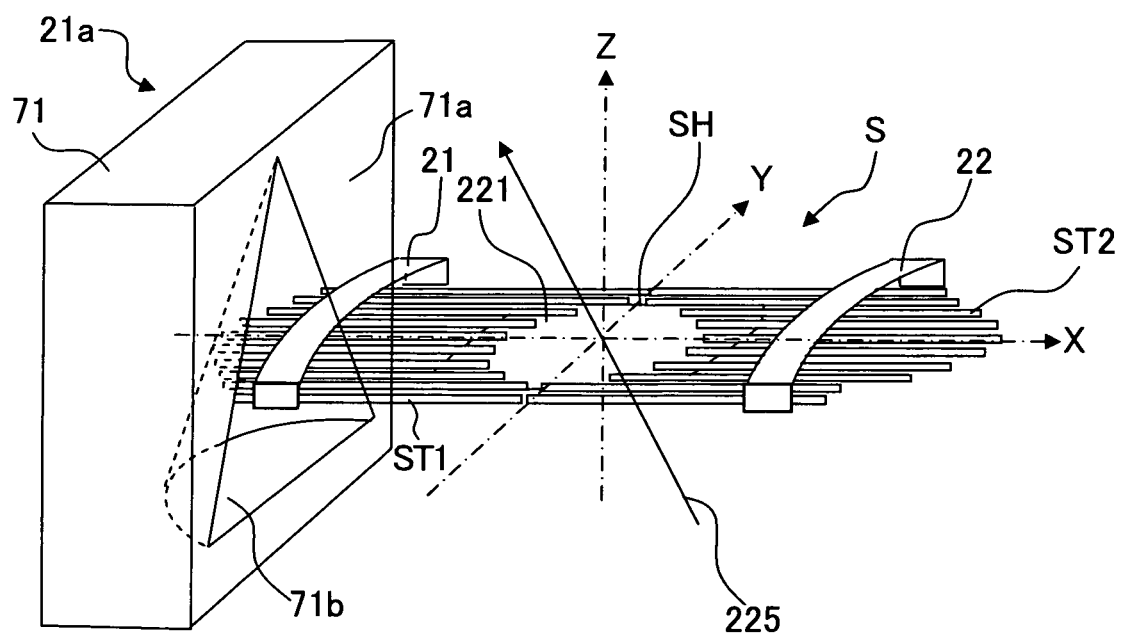
FIG. 13 shows a modification of the driving device in the second embodiment of the present invention.
Figure 14:
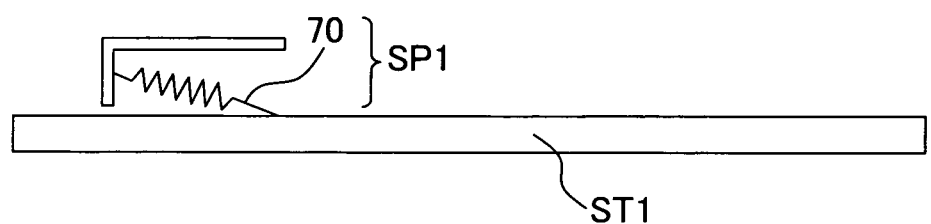
FIG. 14 shows a sectional view of the modification of the driving device in the second embodiment of the present invention.
Figure 14:
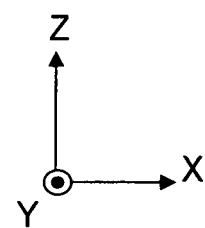

FIGS. 13 and 14 show a driving device (first driving section) 21a in this modification. As shown in FIG. 13, the driving device 21a of this embodiment includes a first shape-generating portion 71a which has a contour shape 71b in order to form the aperture shape of the aperture diaphragm S corresponding to the numerical aperture NA of the projection optical system PL, a first driving member 71 which drives the first shape-generating portion 71a in the optical axis direction (Z direction in FIG. 13), and a first spring mechanism SP1 shown in FIG. 14 which is provided to press each of the first strip members ST1 against the contour shape 71b of the first shape-generating portion 71a. The driving direction of the first shape-generating portion 71a may be the direction of the main light beam (reference numeral 225 shown in FIG. 13).

As shown in FIGS. 13 and 14, the first shape-generating portion 71a is arranged so that the plurality of first strip members ST1 are allowed to correspond to the contour shape 71*b* described above respectively. The first spring mechanism SP1 is connected to each of the plurality of first strip members ST1 in order to press the first strip member ST1 against the contour shape 71*b* of the first shape-generating portion 71*a*. The first spring mechanism SP1 is a mechanism constructed of, for example, a plurality of springs 70 having the forces directed toward the side (side of the contour shape 71*b* of the first shape-generating portion 71*a* in this case) opposite to the side of the aperture portion SH disposed at the end portions in the longitudinal direction of the first strip members ST1. The plurality of first strip members ST1 are connected to the plurality of springs 70 respectively. Therefore, the plurality of first strip members ST1 (or the end portions thereof) are arranged respectively so that the plurality of first strip members ST1 (or the end portions thereof) are pressed against the contour shape 71*b* via the first spring mechanism SP1. By driving the first shape-generating portion 71*a* in the optical axis direction (Z direction) with the first driving member 71, the plurality of first strip members ST1 can integrally form at least a part of the aperture shape of the aperture diaphragm S depending on the shape of the contour shape 71*b* of the first shape-generating portion 71*a*. That is, the contour shape 71*b* of the first shape-generating portion 71*a* defines the shape of the part of the aperture of the aperture diaphragm S.

It is desirable that the contour shape 71*b* of the first shape-generating portion 71*a* is a continuously smooth shape so that the plurality of first strip members ST1 can be moved respectively along the contour shape 71*b* in a case that the first driving member 71 of the driving device 21*a* is driven in the optical axis direction. For example, when the numerical aperture NA of the projection optical system PL is varied by every 0.01 within a range of 0.15 to 0.35, the contour shape 71*b* of the first shape-generating portion 71*a* is defined so that the plurality of first strip members ST1 can form at least a part of the aperture shape of the aperture diaphragm S corresponding to each of the numerical apertures NA of the 21 steps or sizes respectively.

FIGS. 13 and 14 have been explained as exemplified by the first strip members ST1 as an example of the driving device 21*a*. However, the driving device (third driving section) 22, which drives the second strip members ST2, can be also constructed in the same manner as the driving device 21*a* described above. Further, by connecting or correlating the first shape-generating portion 71*a*, which is arranged corresponding to the first strip members ST1, with a second shape-generating portion 72*a* which is arranged corresponding to the second strip members ST2, it is also possible to drive the first shape-generating portion 71*a* and the second shape-generating portion 72*a* in the optical axis direction by at least only the first driving member 71. The driving direction of the first driving member 71 may be the direction of the main light beam (reference numeral 225 shown in FIG. 13).

Figure 15:
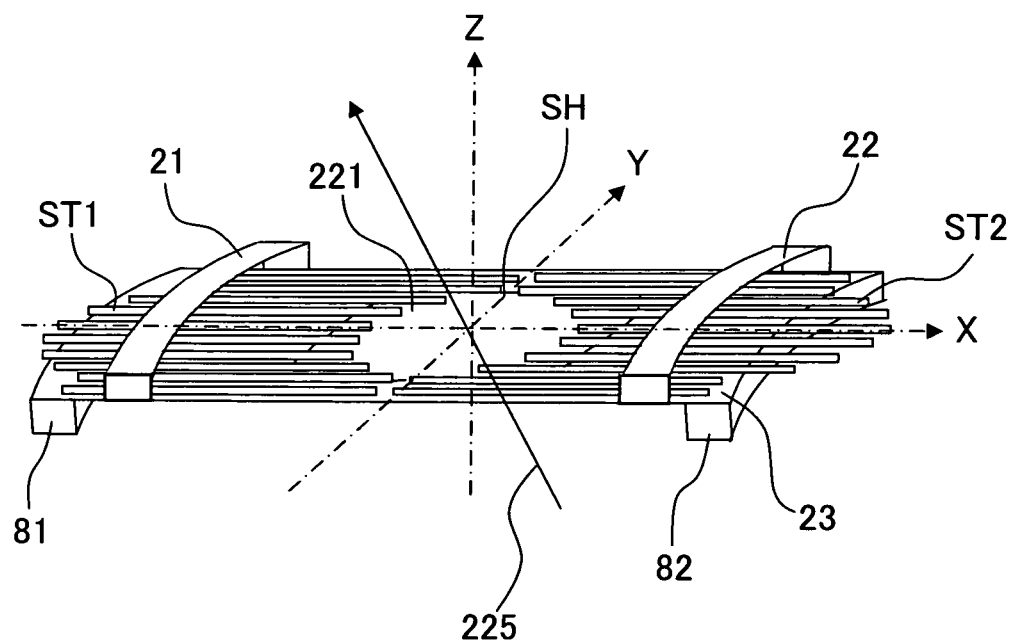
FIG. 15 shows a perspective view of an aperture diaphragm provided with a driving device for driving the strip members in the optical axis direction in the second embodiment of the present invention.

The first strip members ST1 and the second strip members ST2 of the aperture diaphragm S are put in and out (advanced and retracted) one by one in the X direction for the different NA value to form the aperture having the predetermined size in accordance with the shape of the holding portion 23. However, in this situation, the different optimum pupil height is provided for the different NA value. Therefore, there is such a possibility that the optimum pupil height may be changed corresponding to each of the NA values; and in order to take a countermeasure thereagainst, as shown in FIG. 15, it is appropriate to provide driving devices (second driving section, fourth driving section) 81, 82 which are capable of driving the entire aperture diaphragm S in the Y direction and the Z direction (direction parallel to the optical axis AX of the projection optical system PL). The pupil height herein refers to a height (positional deviation) in relation to the Z direction of the light beam in each of the orientations (or in the direction of the main light beam), with the pupil position in relation to the main light beam (position of the minimum circle of confusion) as the reference. In this case, the driving directions of the sliding driving effected by the driving device (second driving section) 81 and the driving device (fourth driving section) 82 are the two axial directions of the Z direction and the Y direction. However, the sliding driving may be effected in the direction of the main light beam 225 (direction intersecting the predetermined plane).

It is also allowable to adopt a driving device (this driving device is hereinafter conveniently referred to as "Z direction individual driving device" in some cases) which performs the sliding driving for each of the individual first strip members ST1 and the individual second strip members ST2 in the Z direction and the Y direction, without inhibiting the sliding driving of the individual first strip members ST1 and the individual second strip members ST2 in the X direction, and without effecting the sliding driving of the aperture diaphragm S as a whole by the driving devices (second driving section, fourth driving section) 81, 82 as described above.

When only the driving devices (first driving section, third driving section) 21, 22, which effect the sliding driving in the X direction, are used, it is possible to change only the size of the aperture concerning the three-dimensional shape in accordance with the shape of the holding portion 23. However, by adopting the Z direction individual driving device as described above, it is possible to finely adjust the three-dimensional shape itself arbitrarily in addition to the size thereof. That is, in a case that NA is changed, the optimum pupil height is changed as described above. However, in accordance with this, the three-dimensional shape itself, which relates to the optimum pupil shape, is slightly changed partially or entirely in some cases. By adopting the Z direction individual driving device, it is possible to respond to such a situation more accurately as well.

Even in a case that NA is not changed, the three-dimensional shape, which relates to the optimum pupil shape, is slightly changed partially or entirely in some cases in accordance with the pattern distribution in the field (distribution of the pattern formed on the mask M). That is, the light beams, which are allowed to travel in the respective orientations at the same NA in relation to the respective points in the field, do not interest at one point, and the minimum circle of confusion, which has a certain size, is formed at a certain height as described above. This means that the light beams, which are allowed to travel from the respective points in the field, depict a variety of optical paths in the vicinity of the pupil; and this means that the height of the minimum circle of confusion, which is obtained when the entire area (for example, 26 mm width) in the field is used, is different from the height of the minimum circle of confusion which is obtained when a part (for example, a right half of the field) in the field is used. An explanation will be made with reference to FIG. 30 again. The respective heights of the positions of the minimum circles of confusion 531 to 535, which are obtained, for example, when the pattern of only the left half or the right half in the field is used, are different from the heights which are obtained when the entire surface in the field is used. Further, the height of the minimum circle of confusion differs between 533 and 534.

Therefore, by three-dimensionally changing and adjusting during the exposure the contour of the aperture of the aperture diaphragm, which is provided even in the case of the same NA, by using the Z direction individual driving device described above depending on the pattern distribution of the mask M to be used, i.e., the area in which the pattern of the mask M exists, it is possible to provide the more highly accurate optical system.

The pattern distribution of the reticle R (distribution in the X direction in this embodiment) can be measured by a pattern distribution measuring device provided for the exposure apparatus. Although not shown, one of various sensors provided on the wafer stage WS can be utilized as the pattern distribution measuring device. However, an exclusive sensor may be provided on the wafer stage WS for the measurement. The pattern distribution as described above can be measured by moving the wafer stage WS to perform the scanning two-dimensionally in a case that a pinhole sensor is used to perform the point measurement, or by performing the scanning in the vertical direction in a case that a line sensor capable of performing the measurement in the one-dimension is used. Alternatively, the pattern distribution can be measured by CCD capable of performing the measurement in the two-dimension. It is possible to obtain a more preferred optical performance by finely adjusting the heights of the individual first strip members ST1 and the individual second strip members ST2 with the Z direction individual driving device by calculating the heights in the respective orientations of the optimum pupil depending on the pattern distribution (distribution in the X direction) of the mask M.

Third Embodiment

Figure 16:
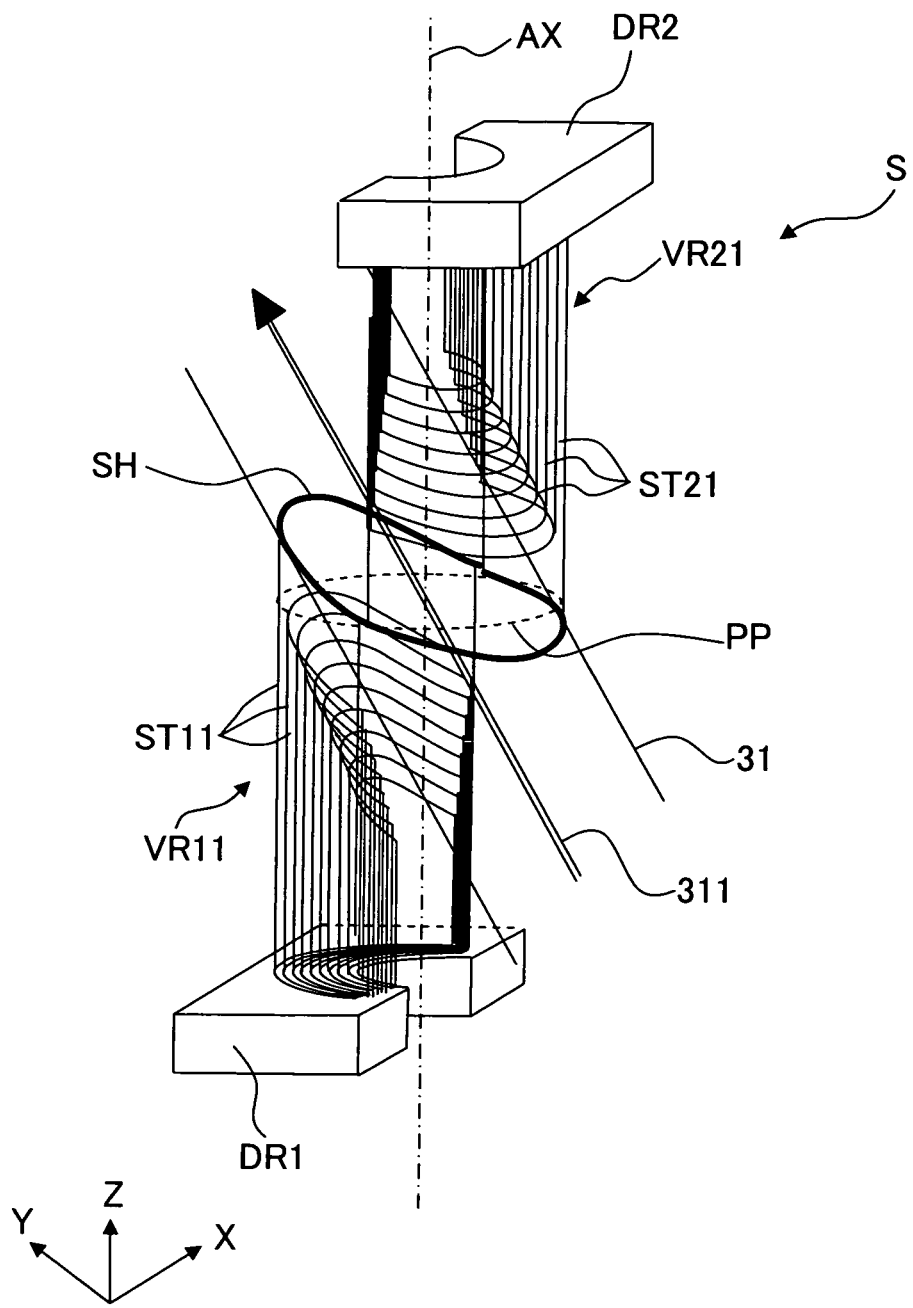
FIG. 16 shows a perspective view of the construction of an aperture diaphragm in a third embodiment of the present invention.

FIG. 16 shows a perspective view of the construction of an aperture diaphragm (NA diaphragm) according to a third embodiment of the present invention. The aperture diaphragm S of this embodiment is a variable aperture diaphragm of such a type that the contour of the aperture is formed by inserting a plurality of substantially semicylindrical first light shielding members ST11 and a plurality of substantially semicylindrical second light shielding members ST21 in the ±Z directions with respect to a light flux 31 passing through the pupil (pupil of the projection optical system PL). In this embodiment, a main light beam 311 of a light flux 31 is inclined by a predetermined angle with respect to the optical axis AX (Z axis), and a pupil plane PP of the projection optical system PL is perpendicular to the optical axis of the projection optical system PL.

The aperture diaphragm S is such a device that the aperture portion SH, which has sizes corresponding to a plurality of NA's (numerical apertures) defined in a stepwise manner, is formed. As shown in FIG. 16, the aperture diaphragm S includes the plurality of first light shielding members ST11 constructing a first variable light shielding member VR11 and the plurality of second light shielding members ST21 constructing a second variable light shielding member VR21, the plurality of (ten in FIG. 16) the first light shielding members ST11 and the plurality of (ten in FIG. 16) the second light shielding members ST21 being arranged respectively.

The first variable light shielding member VR11 has the plurality of first light shielding members ST11 to define at least a part (first portion) of the contour of the aperture shape by one of the plurality of first light shielding members ST11. Similarly, the second variable light shielding member VR21 has the plurality of second light shielding members ST21 to define at least a part (second portion) of the contour of the aperture shape, which is other than the first portion defined by the first light shielding member ST11, by one of the plurality of second light shielding members ST21. In this case, as described later on, the first light shielding member ST11 defines a half of the contour of the aperture shape, and the second light shielding member ST21 defines the remaining half of the contour of the aperture shape.

The plurality of first light shielding members ST11 are constructed of members in each of which at least one surface (inner surface defining the aperture shape) has a curved surface shape (circular arc-shaped, elliptical arc-shaped, or curvedly shaped similarly thereto). As an example, the first light shielding member ST11 is constructed of a semicylindrical (semicircular, semieliptical) or partially cylindrical member having a shape obtained such that a thin flat plate is curved to provide a cross-sectional shape thereof which is circular arc-shaped, elliptical arc-shaped, or curvedly shaped similarly thereto. In this embodiment, for the purpose of convenience, an explanation will be made assuming that the first light shielding member ST11 is constructed of a semicylindrical member.

An end edge of the first light shielding member ST11 (upper end edge in FIG. 16) is arranged while being directed toward a predetermined plane (pupil plane PP of the projection optical system PL or a plane or surface disposed in the vicinity of the pupil plane). In this case, the upper end edge forms at least a part (first portion) of the contour of the aperture shape in relation to the three-dimensional shape to be formed by the aperture diaphragm S. As an example, the material of the first light shielding member ST11 of this embodiment is formed of stainless steel. It is desirable to use, as an example, a metal having a high coefficient of thermal conductivity as the material of the first light shielding member ST11.

The first variable light shielding member VR11 of this embodiment has ten pieces of the first light shielding members. The first light shielding members ST11 have substantially similar shapes so that the diameters are gradually decreased in a direction directed from those disposed on the outer side to those disposed on the inner side; and the first light shielding members ST11 are arranged respectively so that one having a smaller diameter is loosely fitted successively on the inner side of one having a larger diameter with a slight gap intervening therebetween.

The plurality of first light shielding members ST11 of this embodiment are slidably supported in the direction substantially parallel to the optical axis AX (first back and forth movement direction) or in the direction in which the semicylindrical first light shielding members ST11 are extended, via unillustrated support members respectively. Each of the first light shielding members ST11 is connected to a driving device (driving section) DR1 which is provided in order that the first light shielding member ST11 is slidably driven in the direction substantially parallel to the optical axis AX, i.e., the first light shielding member ST11 is driven by being pushed or pulled.

Each of the plurality of first light shielding members ST11 has an end edge (upper end edge) which is set at a waiting position positioned outside of and under or below the optical path disposed between the first mirror PM1 and the second mirror PM2. Any one of the plurality of first light shielding members ST11 is slidably driven by the driving device DR1 upwardly from the lower waiting position as viewed in FIG. 16 (until a position at which the upper end edge of the first light shielding member ST11 arrives at the vicinity of the pupil plane PP) with respect to the optical path disposed between the first mirror PM1 and the second mirror PM2. Accordingly, a part of the shape of the aperture portion SH of the aperture diaphragm S of the projection optical system PL can be changed in a stepwise manner.

The plurality of second light shielding members ST21 are arranged at positions different from those of the plurality of first light shielding members ST11. The plurality of second light shielding members ST21 are constructed of members in each of which at least one surface (inner surface defining the aperture shape) has a curved surface shape (circular arc-shaped, elliptical arc-shaped, or curvedly shaped similarly thereto) in the same manner as the first light shielding members ST11. As an example, the second light shielding member ST21 is constructed of a semicylindrical (semicircular, semieliptical) or partially cylindrical member having a shape obtained such that a thin flat plate is curved to provide a cross-sectional shape thereof which is circular arc-shaped, elliptical arc-shaped, or curvedly shaped similarly thereto. In this embodiment, it is also assumed that the second light shielding member ST21 is constructed of a semicylindrical member.

An end edge of the second light shielding member ST21 (lower end edge in FIG. 16) is arranged while being directed toward the predetermined plane (pupil plane PP of the projection optical system PL or the plane or surface disposed in the vicinity of the pupil plane PP), and is constructed such that the lower end edge forms at least a part (second portion) of the contour of the aperture shape in relation to the three-dimensional shape to be formed by the aperture diaphragm S. Accordingly, the aperture portion SH (inner circumferential portion of the aperture) is defined by the end edge of the first light shielding member ST11 and the end edge of the second light shielding member ST21. The aperture portion SH, which is defined by the end edges of the first light shielding member ST11 and the second light shielding member ST21, does not exit on the predetermined plane intersecting the main light beam 311, for example, in the pupil plane PP of the projection optical system, but the aperture portion SH exists on the curved surface formed by warping the pupil plane PP in the direction of the main light beam. That is, the respective sites of the aperture portion SH (inner circumferential portion of the aperture) exist at the positions offset by predetermined different amounts from the pupil plane PP in the direction of the main light beam. As an example, the material of the second light shielding member ST21 of this embodiment is formed of stainless steel. It is desirable to use, for example, a metal having a high coefficient of thermal conductivity as the material of the second light shielding member ST21.

The second variable light shielding member VR21 of this embodiment has ten pieces of the second light shielding members ST21 corresponding to the ten first light shielding members ST11 described above respectively. The second light shielding members ST21 have substantially similar shapes so that the diameters are gradually decreased in a direction directed from those disposed on the outer side to those disposed on the inner side. The second light shielding members ST21 are arranged respectively so that one having a smaller diameter is loosely fitted successively on the inner side of one having a larger diameter with a slight gap intervening therebetween.

The plurality of second light shielding members ST21 of this embodiment are slidably supported in the direction substantially parallel to the optical axis AX (second back and forth movement direction) or in the direction in which the semicylindrical second light shielding members ST21 are extended, via unillustrated support members respectively. Each of the second light shielding members ST21 is connected to a driving device (driving section) DR2 which is provided in order that the second light shielding member ST21 is slidably driven in the direction substantially parallel to the optical axis AX, i.e., the second light shielding member ST21 is driven by being pushed or pulled.

Each of the plurality of second light shielding members ST21 has an end edge (lower end edge) which is set at a waiting position positioned outside of and over or above the optical path disposed between the first mirror PM1 and the second mirror PM2. Any one of the plurality of second light shielding members ST21 is slidably driven by the driving device DR2 downwardly from the upper waiting position as viewed in FIG. 16 (until a position at which the lower end edge of the second light shielding member ST21 arrives at the vicinity of the pupil plane PP) with respect to the optical path disposed between the first mirror PM1 and the second mirror PM2. Accordingly, a part of the shape of the aperture portion SH, which is different from (other than) the portion defined by the plurality of first light shielding members ST11 and which is included in the shape of aperture portion SH of the aperture diaphragm S of the projection optical system PL, can be changed in a stepwise manner.

Specifically, the inner diameter of each of the first light shielding members ST11 and the inner diameter of each of the second light shielding members ST21 are set, for example, within a range of about 10 mm to 200 mm in accordance with the variable range of the numerical aperture NA of the projection optical system PL (for example, 0.1 to 0.5 or 0.15 to 0.35). The number of the first light shielding members ST11 and the number of the second light shielding members ST21 are exemplified by ten respectively in this case by way of example. However, the number of the first light shielding members ST11 and the number of the second light shielding members ST21 are each set to about 20 to 40 in accordance with the number of sizes corresponding to the number of steps of the numerical aperture NA (for example, 0.01 or 0.005). The spacing distance between the respective first light shielding members ST11 and the spacing distance between the respective second light shielding members ST21 are set, for example, to about 2 to 3 mm in relation to the plate thicknesses thereof (for example, about 0.2 mm).

In this embodiment, the plurality of first light shielding members ST11 and the plurality of second light shielding members ST21 mutually form the pairs respectively. The plurality of first light shielding members ST11 and the plurality of second light shielding members ST21 are arranged to be opposite to or to face one another with the pupil plane PP or the plane or surface disposed in the vicinity thereof so that the aperture shape is defined by the upper end edge of the first light shielding member ST11 and the lower end edge of the second light shielding member ST21 corresponding thereto on the pupil plane PP or the plane or surface disposed in the vicinity thereof. The plurality of first light shielding members ST11 and the plurality of second light shielding members ST21 are moved mutually opposingly back and forth (moved in the mutually opposite directions) respectively by the driving devices DR1, DR2 respectively.

As described above, the aperture diaphragm S of this embodiment is constructed so that the aperture shape thereof can be formed by the plurality of first light shielding members ST11 which are allowed to slide (move back and forth) in the first back and forth movement direction (direction of the optical axis AX in this embodiment) and the plurality of second light shielding members ST21 which are allowed to slide (move back and forth) in the second back and forth movement direction (direction of the optical axis AX in this embodiment). Thus, it is possible to construct the aperture diaphragm which is capable of varying the numerical aperture NA in the stepwise manner depending on the numerical aperture NA to be selectively set or defined.

In this embodiment, the sliding direction (first back and forth movement direction) of the first light shielding member ST11 and the sliding direction (second back and forth movement direction) of the second light shielding member ST21 are the direction of the optical axis AX of the projection optical system PL. However, it is allowable that the first back and forth movement direction and the second back and forth movement direction are a direction which intersects the predetermined plane, i.e., a direction other than the direction which is parallel to the predetermined plane (other than the direction which is perpendicular to the optical axis AX). It is appropriate that the first and second back and forth movement directions are set in a direction suitable to avoid any mechanical interference, for example, with the mirrors constructing the optical system as well as the holding members thereof.

Those usable as the driving device DR1 (driving section) described above for causing the plurality of first light shielding members ST11 to slide include one which causes each of the first light shielding members ST11 to slide by a mechanism having a stepping motor, a rack and pinion, etc. As for the driving device DR1, it is also allowable to use one which has an actuator constructed of a linear motor connected to each of the first light shielding members ST11 to cause the first light shielding members to slide by the motive power from the actuator, instead of the mechanism constructed of the stepping motor, the rack and pinion, etc.

The explanation has been made about an example of the driving device DR1 described above wherein the first light shielding member ST11 is made to slide by way of example. However, a construction, which is same as or equivalent to that for causing the first light shielding member ST11 to slide as described above, can be also adopted for the driving device DR2 (second driving section) for the second light shielding member ST21.

The driving device DR1 described above is constructed such that the driving device DR1 can be driven in a predetermined amount based on the control signal from the unillustrated controller so that the plurality of first light shielding members ST11 can form at least the part (first portion) of the contour of the aperture shape of the aperture diaphragm S. Further, the driving device DR2 described above is constructed such that the driving device DR2 can be driven in a predetermined amount based on the control signal from the unillustrated controller so that the plurality of second light shielding members ST21 can form at least the part (second portion) of the contour of the aperture shape of the aperture diaphragm S.

As described above, the aperture diaphragm S concerning this embodiment is constructed so that the aperture shape of the aperture diaphragm S can be formed by the plurality of first light shielding members ST11 and the plurality of second light shielding members ST21 on the pupil plane PP or the plane or surface disposed in the vicinity thereof. Further, the aperture diaphragm S concerning this embodiment is constructed so that each of the first light shielding members ST11 is made to slide independently by the driving device DR1, and that each of the second light shielding members ST21 is made to slide independently by the driving device DR2. Accordingly, it is possible to change the numerical aperture NA of the projection optical system PL in the stepwise manner.

Next, the operation of the aperture diaphragm S of this embodiment will be explained with reference to FIGS. 17 to 23. In order to simplify the description, an explanation will now be made assuming that those provided as the first light shielding members ST11 are five as counted from a first light shielding member ST11-1 defining the maximum NA to a first light shielding member ST11-5 defining the minimum NA, and those provided as the second light shielding members ST21 are five as counted from a second light shielding member ST21-1 defining the maximum NA to a second light shielding member ST21-5 defining the minimum NA. The upper end edges of the respective first light shielding members ST11-1 to ST11-5 and the lower end edges of the respective second light shielding members ST21-1 to ST21-5 are formed to define the aperture shape concerning the three-dimensional shape as described above. Therefore, the respective upper end edges and the respective lower end edges are not necessarily positioned on the pupil plane PP upon the insertion into the optical path. However, these components are conveniently depicted as if the upper and lower end portions are positioned on the pupil plane PP, because FIGS. 17 to 23 are for explaining the operation.

For example, a first light shielding member ST11-3 defines the intermediate NA between those defined by the first light shielding member ST11-1 and the first light shielding member ST11-5, a first light shielding member ST11-2 defines the intermediate NA between those defined by the first light shielding member ST11-1 and the first light shielding member ST11-3, and a first light shielding member ST11-4 defines the intermediate NA between those defined by the first light shielding member ST11-5 and the first light shielding member ST11-3. Further, for example, a second light shielding member ST21-3 defines the intermediate NA between those defined by the second light shielding member ST21-1 and the second light shielding member ST21-5, a second light shielding member ST21-2 defines the intermediate NA between those defined by the second light shielding member ST21-1 and the second light shielding member ST21-3, and a second light shielding member ST21-4 defines the intermediate NA between those defined by the second light shielding member ST21-5 and the second light shielding member ST21-3.

Figure 17:
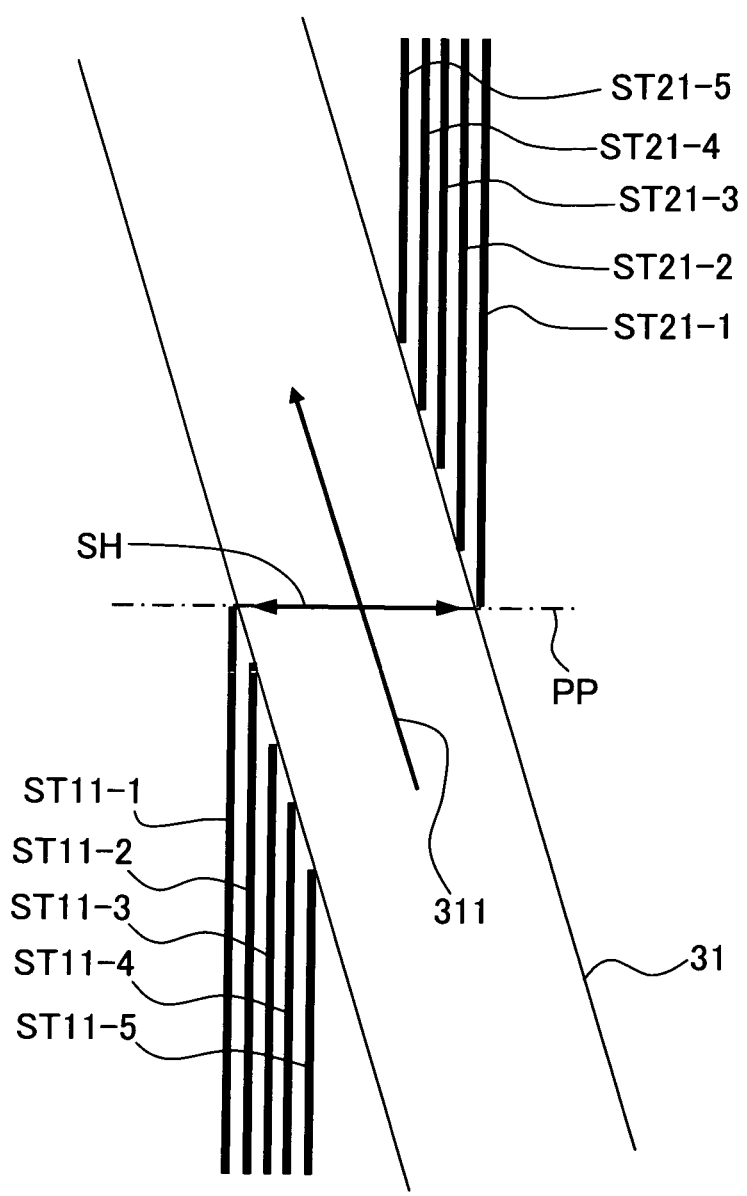
FIG. 17 shows the operation of first and second light shielding members in the third embodiment of the present invention, and shows a situation to define the maximum NA.

FIG. 17 shows a state in which all of the first light shielding members ST11-1 to ST11-5 and all of the second light shielding members ST21-1 to ST21-5 are set at the waiting positions. In the state of being set at the waiting positions, the first light shielding member ST11-1 and the second light shielding member ST21-1, which define the maximum NA, have the end portions (upper end edge of the first light shielding member, lower end edge of the second light shielding member) which are set on the pupil plane PP or at predetermined positions located in the vicinity thereof. The other first light shielding members ST11-2 to ST11-5 and the other second light shielding members ST21-2 to ST21-5 have the end portions which are set at the outside of the optical path defined by the first light shielding member ST11-1 and the second light shielding member ST21-1. Accordingly, the aperture portion SH, which corresponds to the maximum NA, is formed.

In this embodiment, it is assumed that the first light shielding member ST11-1 and the second light shielding member ST21-1, which define the maximum NA, are fixed at the positions shown in FIGS. 17 to 21. However, it is also allowable that the first light shielding member ST11-1 and the second light shielding member ST21-1, which define the maximum NA, are provided slidably in the same manner as the other first light shielding members ST11-2 to ST11-5 and the other second light shielding members ST21-2 to ST21-5.

Figure 18:
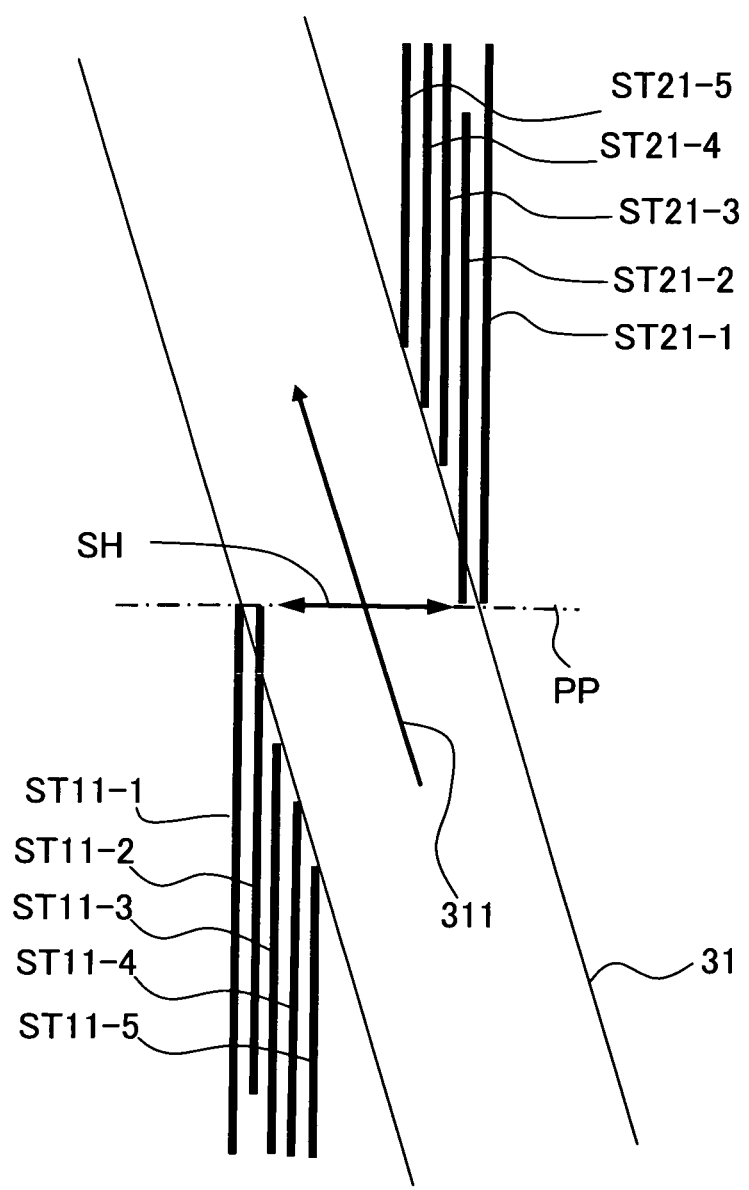
FIG. 18 shows the operation of the first and second light shielding members in the third embodiment of the present invention, and shows a situation to define NA that is one size or one step smaller than the maximum NA.
Figure 19:
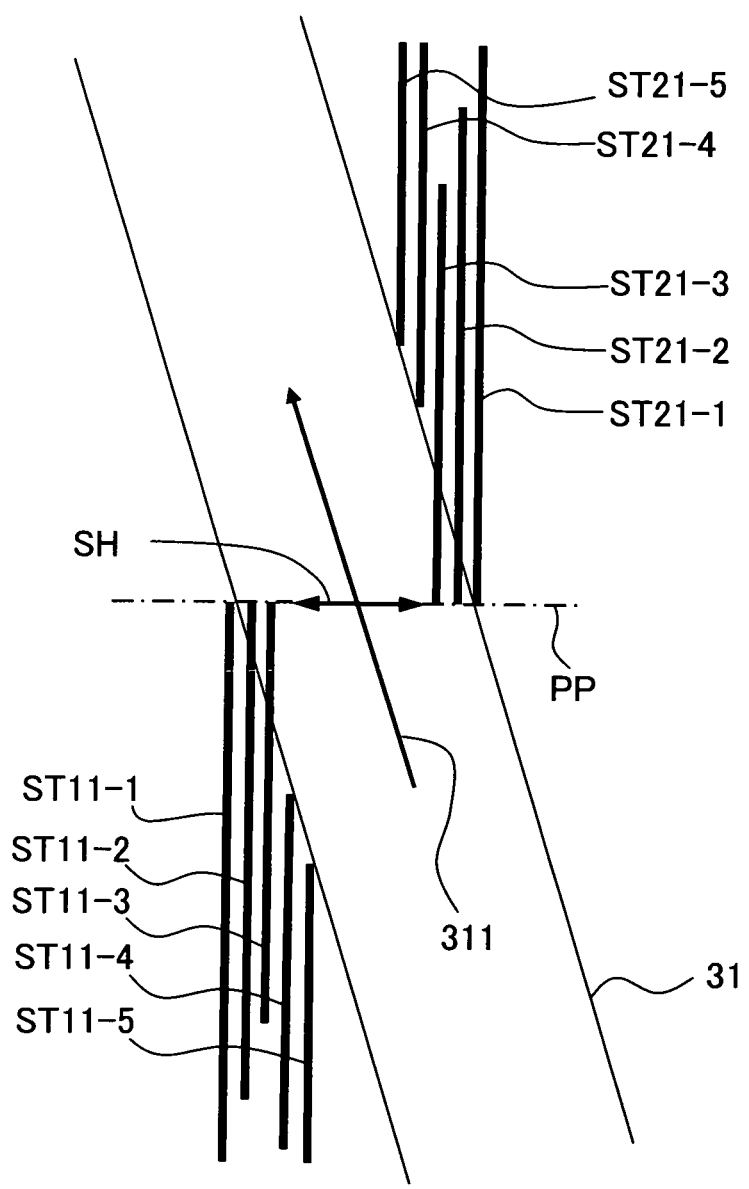
FIG. 19 shows the operation of the first and second light shielding members in the third embodiment of the present invention, and shows a situation to define NA that is two size or two step smaller than the maximum NA.

In a case that NA, which is one size smaller than the maximum NA, is defined, as shown in FIG. 18, the first light shielding member ST11-2 and the second light shielding member ST21-2 corresponding thereto are made to slide toward the pupil plane PP so that the end portions thereof are positioned on the pupil plane PP or at predetermined positions located in the vicinity thereof respectively. Accordingly, the aperture portion SH, which corresponds to NA that is one size smaller than the maximum NA, is formed. In a case that NA, which is two size smaller than the maximum NA, is defined, as shown in FIG. 19, the first light shielding member ST11-3 and the second light shielding member ST21-3 corresponding thereto are made to slide toward the pupil plane PP so that the end portions thereof are positioned on the pupil plane PP or at predetermined positions located in the vicinity thereof respectively. Accordingly, the aperture portion SH, which corresponds to NA that is two size smaller than the maximum NA, is formed.

Figure 20:
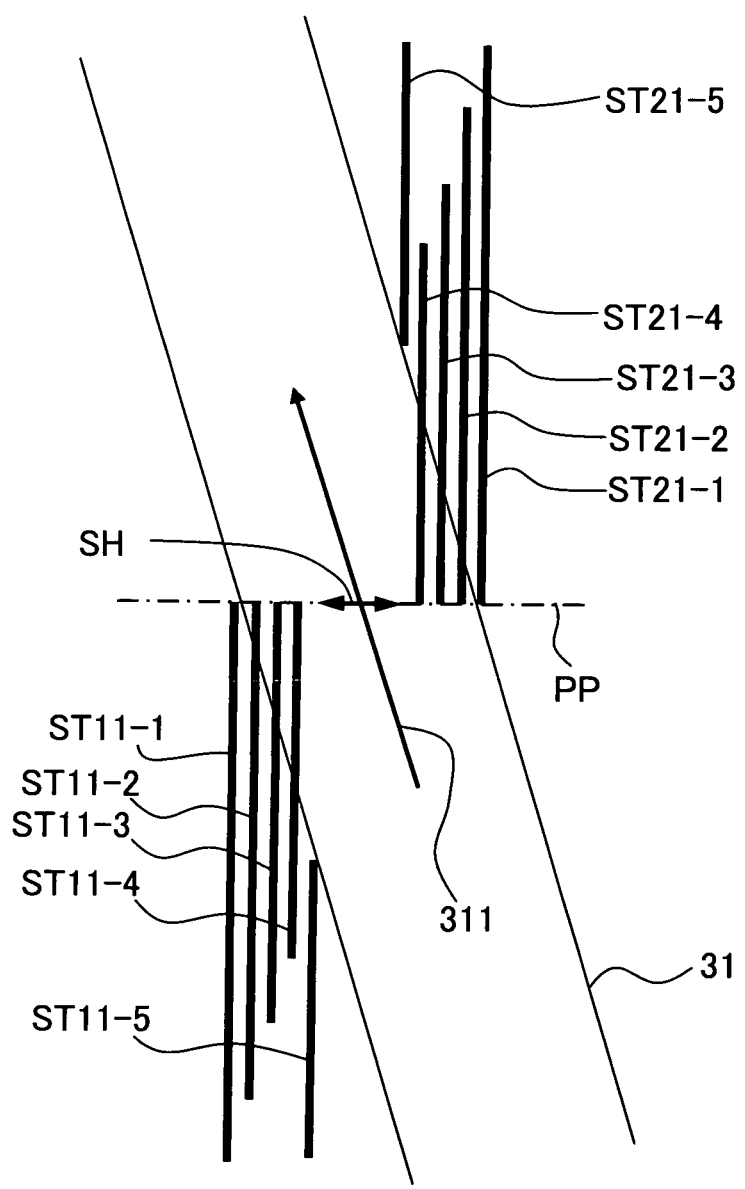
FIG. 20 shows the operation of the first and second light shielding members in the third embodiment of the present invention, and shows a situation to define NA that is one size or one step larger than the minimum NA.
Figure 21:
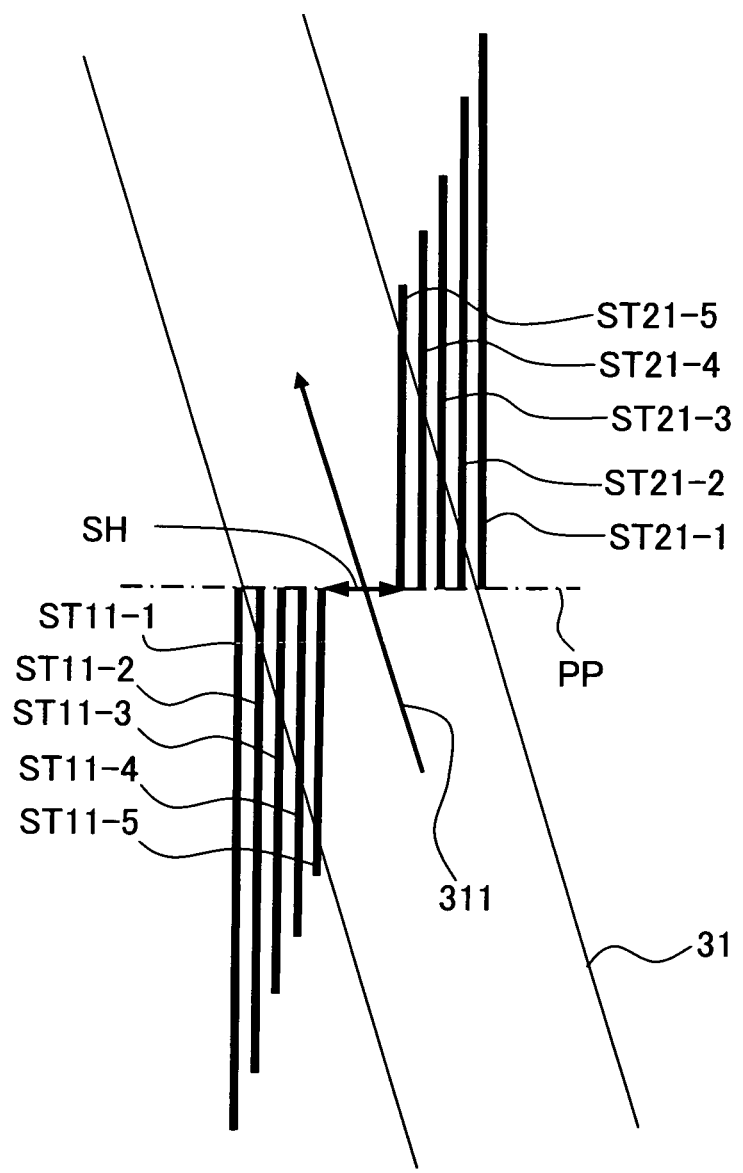
FIG. 21 shows the operation of the first and second light shielding members in the third embodiment of the present invention, and shows a situation to define the minimum NA.

In a case that NA, which is one size larger than the minimum NA, is defined, as shown in FIG. 20, the first light shielding member ST11-4 and the second light shielding member ST21-4 corresponding thereto are made to slide toward the pupil plane PP so that the end portions thereof are positioned on the pupil plane PP or at predetermined positions located in the vicinity thereof respectively. Accordingly, the aperture portion SH, which corresponds to NA that is one size larger than the minimum NA, is formed. In a case that the minimum NA is defined, as shown in FIG. 21, the first light shielding member ST11-5 and the second light shielding member ST21-5 corresponding thereto are made to slide toward the pupil plane PP so that the end portions thereof are positioned on the pupil plane PP or at predetermined positions located in the vicinity thereof respectively. Accordingly, the aperture portion SH, which corresponds to the minimum NA, is formed.

Figure 22:
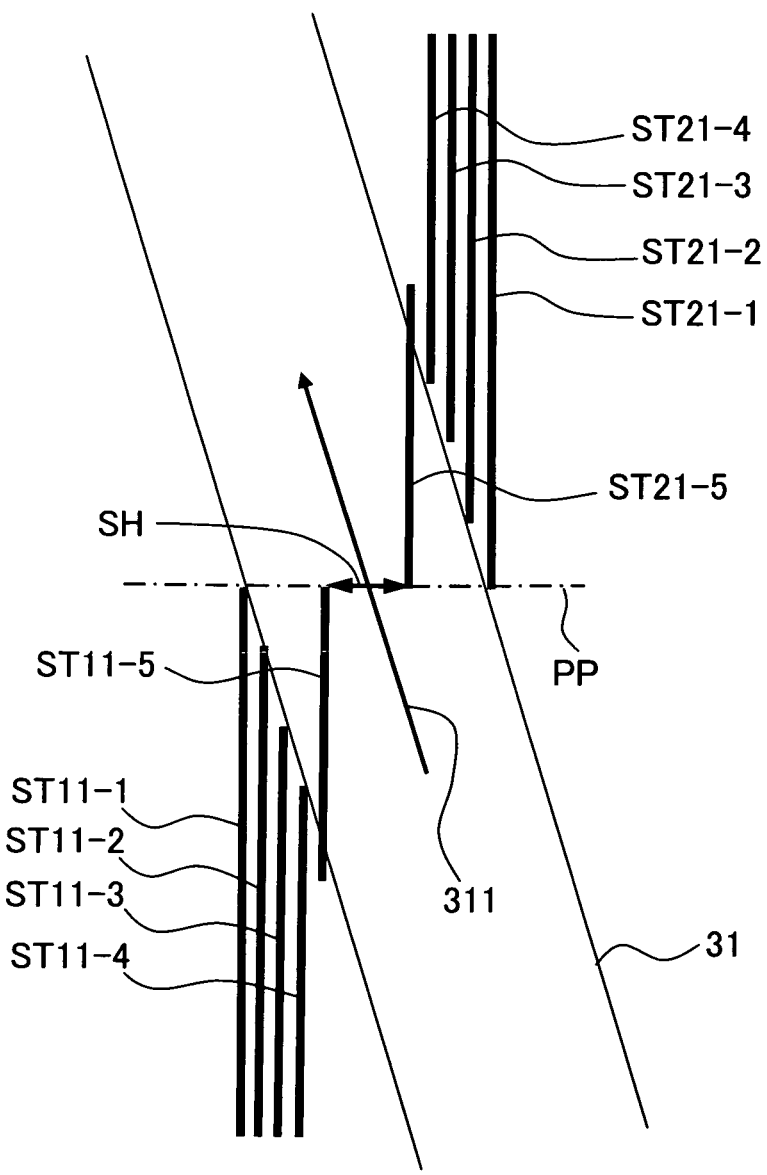
FIG. 22 shows another operation of the first and second light shielding members in the third embodiment of the present invention.

As shown in FIG. 22, for example, in a case that a smaller NA is defined (FIG. 22 depicts the case of the minimum NA), all of or any one of the first light shielding members (ST11-2 to ST11-4 in FIG. 22) and the second light shielding members (ST21-2 to ST21-4 in FIG. 22), which define the larger NA's than the smaller NA, may be allowed to remain and wait at the waiting positions.

As described above, by causing the first light shielding member ST11 and the second light shielding member ST21, which form the pair, to slide in the opposite directions so that the pair of the first and second light shielding members ST11 and ST12 are opposite to or facing each other, it is possible to change the aperture shape, which relates to the three-dimensional shape to be formed by the aperture diaphragm S, in the stepwise manner from the shape corresponding to the maximum NA to the shape corresponding to the minimum NA.

Figure 23:
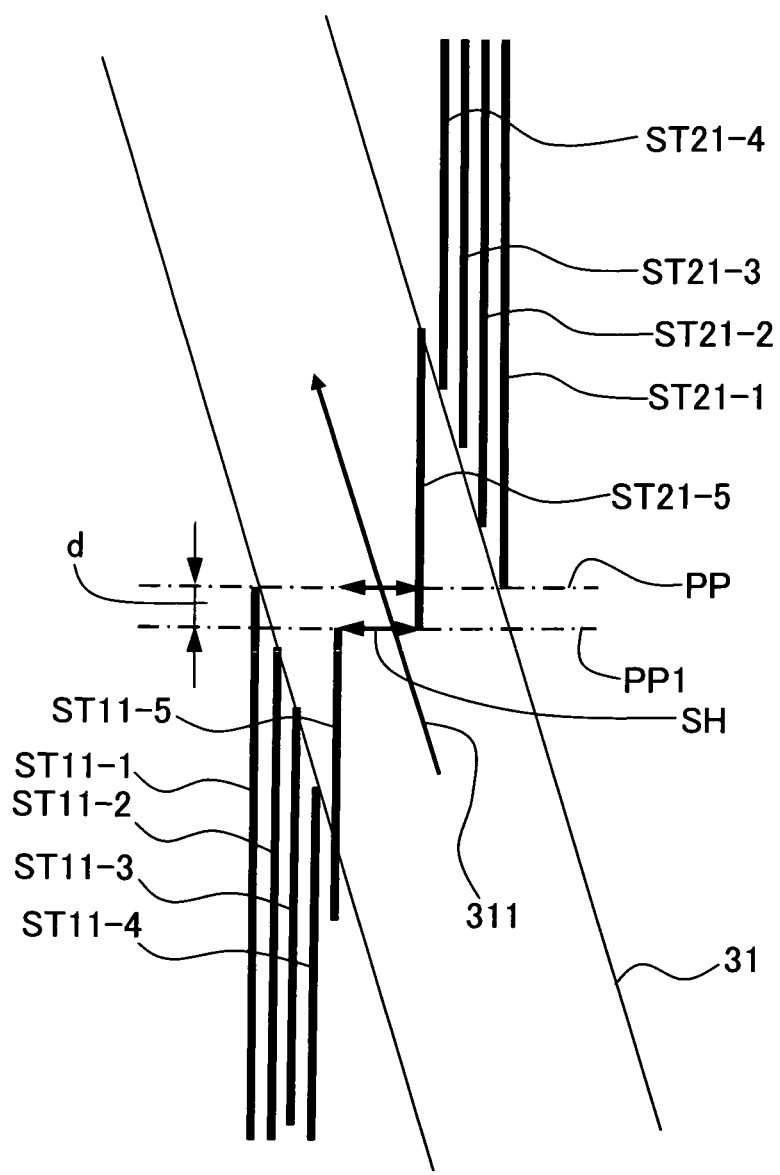
FIG. 23 shows still another operation of the first and second light shielding members in the third embodiment of the present invention.

In a case that the position, at which the aperture is to be formed, is shifted in the optical axis direction or the direction of the main light beam as compared with the position of the pupil plane PP, accompanying with the change of the numerical aperture NA, then as shown in FIG. 23, the first light shielding member ST1 and the second light shielding member ST2, which are opposite to or face each other, are positioned at positions each shifted or deviated, by an amount d corresponding to the shift amount, from the pupil plane PP to a position designated by a reference numeral PP1. As an example, when the minimum NA is defined, the first light shielding member ST11-5 and the second light shielding member ST21-5 are positioned so that the end portions thereof are set at the positions designated by the reference numeral PP1 respectively.

As described above, the end edge (upper end edge) of the first light shielding member ST11 and the end edge (lower end edge) of the second light shielding member ST21 are not shaped such that the shapes thereof are cut by planes, but are cut to have shapes formed along the predetermined three-dimensional curved line so that the optimum aperture shape is defined corresponding to NA as viewed in the X axis direction. Therefore, the contour of the aperture, which is formed as a whole by the pair of the first light shielding member ST11 and the second light shielding member ST21, is also formed along the three-dimensional curved line as described above. The contour of the aperture is the three-dimensional curved line obtained by connecting the optimum pupil heights in the respective orientations previously calculated by the ray tracing in accordance with the NA value.

The different optimum pupil height is provided for the different NA value. Therefore, the aperture shapes, which are to be formed, are not merely similar shapes among the respective NA's, and the shapes slightly differ in some cases. Therefore, the end edges of the pair of the first light shielding member ST11 and the second light shielding member ST21 do not necessarily have similar shapes, and have shapes different therefrom. However, the shapes do not differ conspicuously. Therefore, it is also allowable to approximately use those having mutually similar shapes.

As described above, according to this embodiment, the contour of the aperture concerning the three-dimensional shape is formed by the first light shielding member ST11 and the second light shielding member ST21 which mutually form the pair, with respect to any arbitrary NA value set in the stepwise manner. Therefore, the optimum pupil can be obtained for every orientation; and thus it is possible to obtain the good or satisfactory optical performance.

Figure 24:
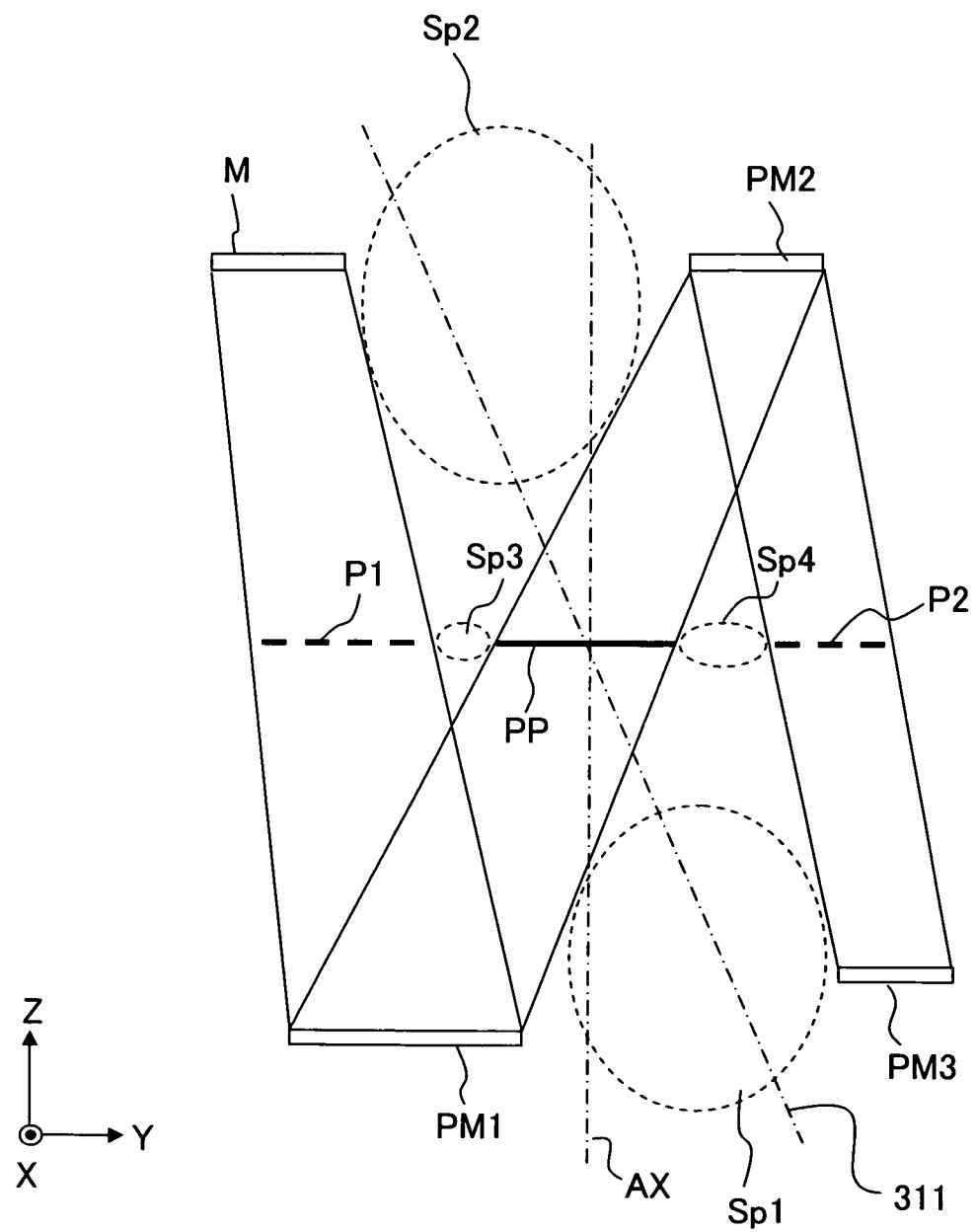
FIG. 24 shows a front view schematically illustrating main components or parts of a projection optical system in the third embodiment of the present invention.

Next, an explanation will be made about the arrangement of the aperture diaphragm S constructed of the first light shielding members ST11 and the second light shielding members ST21. FIG. 24 schematically illustrates the arrangement of the first light shielding members ST11 and the second light shielding members ST21 in the projection optical system PL of this embodiment. As described above, the aperture diaphragm S of this embodiment forms the aperture concerning the three-dimensional shape on the pupil plane PP of the projection optical system PL or at the position in the vicinity of the pupil plane PP formed in the optical path disposed between the first mirror PM1 and the second mirror PM2. The plurality of first light shielding members ST11 are arranged respectively so as to form at least a part (first portion) of the aperture shape of the aperture diaphragm S defining the light flux on the pupil plane PP or at the position disposed in the vicinity of the pupil plane PP. Further, the plurality of second light shielding members ST21 are arranged respectively so as to form at least a part (second portion) of the aperture shape of the aperture diaphragm S defining the light flux on the pupil plane PP or at the position disposed in the vicinity of the pupil plane PP.

In the projection optical system PL of this embodiment, as shown in FIG. 24, the light flux, which comes into the first mirror PM1 via the mask M, passes through a portion P1 located closely to the pupil plane PP in the −Y direction; and the light flux, which comes into the third mirror PM3 via the second mirror PM2, passes through a portion P2 located closely to the pupil plane PP in the +Y direction.

In this way, the projection optical system PL of this embodiment is the coaxial reflection optical system. Therefore, a plurality of optical paths are disposed closely to one another in the Y direction in the vicinity of the pupil plane on which the aperture diaphragm S is to be arranged; and portions (spaces) Sp3, Sp4, which are located or disposed between the optical paths, are generally small. However, as appreciated from FIG. 24, certain portions, in which any other optical path is not arranged closely, are present in the direction intersecting the pupil plane PP. That is, sufficiently large spaces, in which any other optical path is not arranged, exist in a portion Sp1 which is located under or below the optical path between the first mirror PM1 and the second mirror PM2 and which is provided between the first mirror PM1 and the third mirror PM3 and in a portion Sp2 which is located over or above the optical path between the first mirror PM1 and the second mirror PM2 and which is provided between the mask M and the second mirror PM2.

Therefore, in a case that the respective light fluxes, which are reflected by the respective mirrors, are arranged closely to the pupil plane PP, then the light fluxes are shielded, and it is difficult to achieve the arrangement in the case of any conventional aperture diaphragm in which it is necessary that the arrangement should be made to surround the surroundings of the pupil plane PP. However, in the case of the aperture diaphragm S of this embodiment, as shown in FIG. 24, the plurality of first light shielding members ST11 are arranged in the space Sp1 wherein the sliding direction thereof is set in the direction substantially parallel to the optical axis AX. Therefore, the plurality of first light shielding members ST11 can be arranged without shielding any other light flux located or disposed closely thereto. Similarly, as shown in FIG. 24, the plurality of second light shielding members ST21 are arranged in the space Sp2 wherein the sliding direction thereof is set in the direction substantially parallel to the optical axis AX. Therefore, the plurality of second light shielding members ST21 can be arranged without shielding any other light flux located or disposed closely thereto.

In this way, the numerical aperture NA of the projection optical system PL can be changed in the stepwise manner by the aperture diaphragm S of this embodiment, without shielding any optical path of the projection optical system PL, for example, even in a case of such an construction that the optical paths of the projection optical system PL are disposed closely to one another in the vicinity of the pupil plane PP of the projection optical system PL by bending the optical paths of the projection optical system PL by the respective mirrors PM1 to PM6. Therefore, it is possible to enhance the degree of freedom of the design of the projection optical system PL, and it is possible to miniaturize or small-size the projection optical system PL.

In the embodiment described above, the plurality of first light shielding members ST11 and the plurality of second light shielding members ST21 are subjected to the sliding driving by the respective driving devices DR1, DR2 in accordance with the numerical aperture NA to be selectively set, and thus the numerical aperture NA can be automatically changed. However, it is also allowable to adopt such a construction that any one of or both of the first light shielding members ST11 and the second light shielding members ST21 is/are slidably movable manually.

Figure 25:
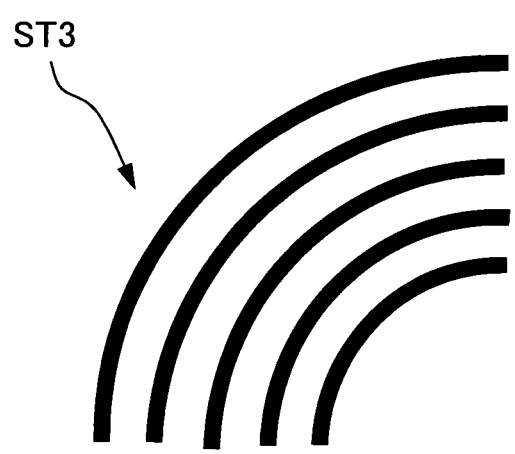
FIG. 25 shows a top view of the construction of light shielding members constructed of partially cylindrical members divided into four)(90°) in the third embodiment of the present invention.

In the embodiment described above, the aperture shape to be formed is divided into two which are defined by the semi-cylindrical first light shielding member ST11 and the semi-cylindrical second light shielding member ST21 respectively. However, the aperture shape to be formed may be divided into three or more which may be defined by a plurality of partially cylindrical light shielding members respectively. For example, in a case that the aperture shape to be formed is divided into four as shown in FIG. 25, then four sets of a plurality of partially cylindrical light shielding members ST3, which have circular arc-shaped cross sections corresponding to 90° portions of the aperture shape to be formed, may be provided, and the aperture shape may be defined by the four sets of the light shielding members ST3 in accordance with each of the numerical aperture NA's.

In the embodiment described above, the plurality of first light shielding members ST11 constructing the first variable light shielding member VR11 and the plurality of second light shielding members ST21 constructing the second variable light shielding member VR21 are constructed to be slidable respectively. However, the following construction is also available. That is, a plurality of fixed light shielding members which define the second portion of the aperture shape may be prepared, instead of the second variable light shielding member VR21; and any one of the plurality of fixed light shielding members may be fixed exchangeably to the predetermined plane. In this case, the fixed light shielding member is constructed so that at least the part (second portion) of the aperture shape of the average and optimum aperture diaphragm S is formed within a range (for example, 0.15 to 0.35) of the numerical aperture NA of the projection optical system PL. The plurality of fixed light shielding members, which have different shapes depending on the number of sizes of the numerical aperture NA, are prepared. When the numerical aperture NA is changed, a fixed light shielding member, which has the corresponding shape, is exchangeably attached.

It is possible to exchangeably fix, as the fixed light shielding members, members which area same as the plurality of second light shielding members ST21 described above to the frame of the projection optical system PL, etc. Even in such a case as described above, the aperture diaphragm S according to this embodiment is constructed so that the aperture shape thereof can be formed by the plurality of first light shielding members ST11 and the fixed light shielding members described above. Therefore, it is possible to change the numerical aperture NA of the projection optical system PL in a stepwise manner without arranging any mechanical mechanism along the surroundings of the pupil plane PP of the projection optical system PL.

Fourth Embodiment

Figure 26:
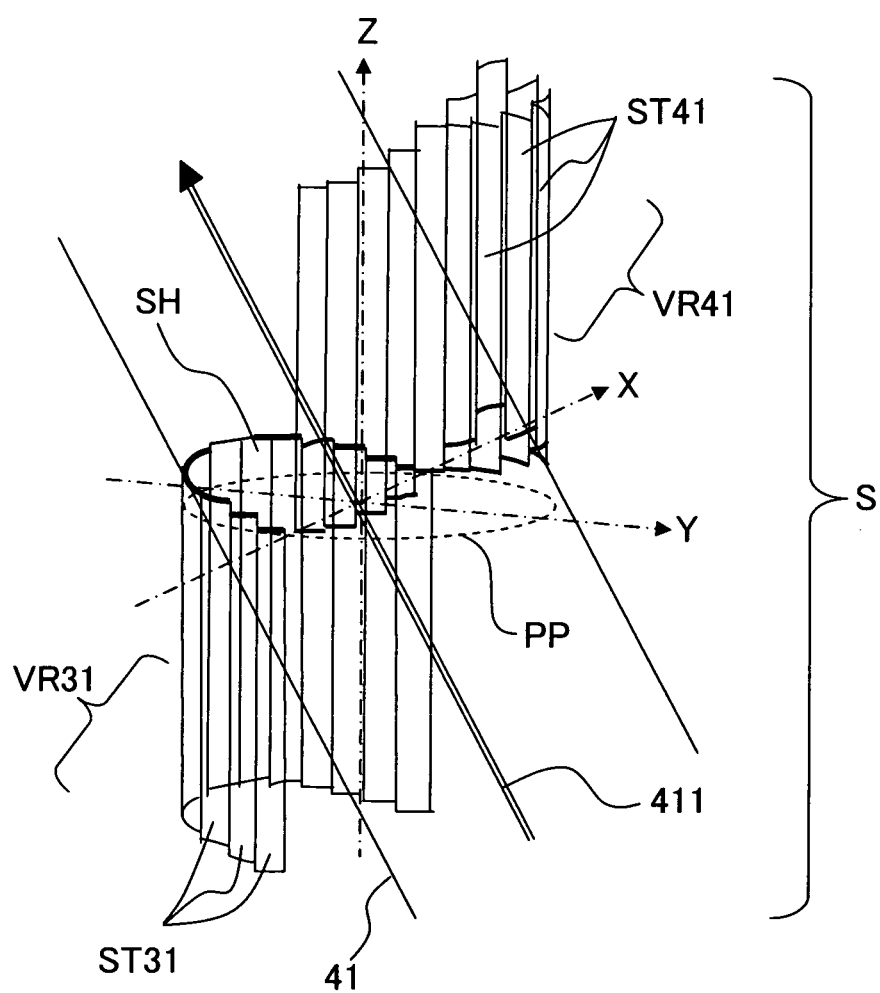
FIG. 26 shows a perspective view of the construction of an aperture diaphragm in a fourth embodiment of the present invention.
Figure 27:
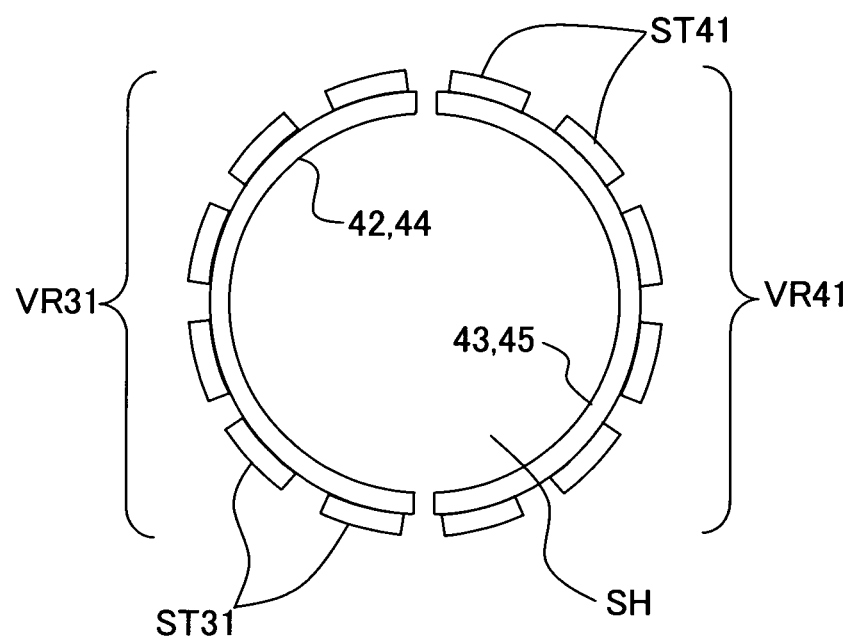
FIG. 27 shows a top view of the construction of the aperture diaphragm in the fourth embodiment of the present invention.

FIG. 26 shows a perspective view of the construction of an aperture diaphragm (NA diaphragm) according to a fourth embodiment of the present invention, and FIG. 27 shows a top view of the same. The aperture diaphragm S of this embodiment is a variable aperture diaphragm of such a type that the contour of the aperture is formed by inserting a plurality of third strip members ST31 and a plurality of fourth strip members ST41 respectively in the ±Z directions with respect to the light flux 41 including a main light beam 411 passing through the pupil.

As shown in FIGS. 26 and 27, in the aperture diaphragm S of this embodiment, a plurality of (twelve in FIGS. 26 and 27) the third strip members ST31 (example of first light shielding members) constructing a third variable light shielding member VR31 and a plurality of (twelve in FIGS. 26 and 27) the fourth strip members ST41 (example of second light shielding members) constructing a fourth variable light shielding member VR41 are arranged while being directed toward the pupil plane PP of the aperture diaphragm S or the vicinity of the pupil plane PP. In this case, the third variable light shielding member VR31 has the plurality of third strip members ST31 to define at least a part (first portion) of the contour of the aperture shape of the aperture diaphragm S by the plurality of third strip members ST31. Similarly, the fourth variable light shielding member VR41 has the plurality of fourth strip members ST41 to define at least a part (second portion) of the contour of the aperture shape of the aperture diaphragm S by the plurality of fourth strip members ST41.

The third strip members ST31 are elongated or lengthy partially cylindrical members obtained by dividing the semi-cylindrical first strip member ST11 shown in FIG. 16 in the third embodiment described above into a large number of pieces in the Z direction. Ends in the longitudinal direction of the third strip members ST31 (upper ends as shown in FIG. 26) are arranged toward the pupil plane PP or the vicinity thereof, and the ends in the longitudinal direction form at least the part (first portion) of the contour of the aperture shape of the aperture diaphragm S in this construction. The longitudinal direction of the plurality of third strip members ST31 is substantially parallel to the Z direction, and the plurality of third strip members ST31 are arranged closely to one another in the transverse direction thereof. The third strip members ST31 may be lengthy flat plates.

Similarly, the fourth strip members ST41 described above are also elongated or lengthy partially cylindrical members obtained by dividing the second strip member ST21 shown in FIG. 16 in the third embodiment described above into a large number of pieces in the Z direction. Ends in the longitudinal direction of the fourth strip members ST41 (lower ends as shown in FIG. 26) are arranged toward the pupil plane PP or the vicinity thereof at positions different from those of the third strip members ST31, and the ends in the longitudinal direction form at least the part (second portion) of the contour of the aperture shape of the aperture diaphragm S in this construction. The longitudinal direction of the plurality of fourth strip members ST41 is substantially parallel to the Z direction, and the plurality of fourth strip members ST41 are arranged closely to one another in the transverse direction thereof. The fourth strip members ST41 may be lengthy flat plates. In this way, in the case of the aperture diaphragm S of this embodiment, the ends in the longitudinal direction of the third strip members ST31 and the ends in the longitudinal direction of the fourth strip members ST41 cooperate with each other to define the contour of the aperture shape of the aperture diaphragm S or the aperture portion SH (or the inner circumferential portion of the aperture). The aperture portion SH does not exist in the pupil plane PP, but the aperture portion SH exists in the plane or surface obtained by warping the pupil plane PP in the direction of the main light beam 411.

As shown in FIG. 27, the third strip members ST31 and the fourth strip members ST41 are held by holding portions 42, 43 movably (slidably) back and forth in the Z direction (longitudinal direction of the third strip members ST31 and the fourth strip members ST41 in this case) respectively. Holding surfaces of the holding portions 42, 43 are curved approximately along a two-dimensional curved line obtained by projecting a predetermined three-dimensional curved line onto the pupil plane PP (X-Y plane) as viewed in Z direction. Therefore, the contour of the aperture, which extends approximately along the two-dimensional curved line obtained by projecting the predetermined three-dimensional curved line onto the pupil plane PP, is obtained by the inner surfaces of the third strip members ST31 and the fourth strip members ST41. The predetermined three-dimensional curved line is obtained by connecting the optimum pupil heights in the respective orientations previously calculated by the ray tracing in accordance with the NA value. The holding portions 42, 43 are constructed so that the third strip members ST31 and the fourth strip members ST41 are disposed along the two-dimensional curved line obtained by projecting the three-dimensional curved line onto the pupil plane PP.

A driving device (driving section) 44, which slidably drives the third strip member ST31 in the longitudinal direction (Z direction), i.e., which drives the third strip member ST31 by pushing and pulling the third strip member ST31, is connected to each of the third strip members ST31. In this case, it is assumed that the driving device 44 is incorporated into the holding portion 42, and the driving device 44 is depicted as the same portion as the holding portion 42 in FIG. 27. Therefore, in the projection optical system PL of this embodiment, the part (left half in FIGS. 26 and 27) of the shape of the aperture concerning the predetermined three-dimensional curved line described above can be changed by slidably driving the third strip member ST31 in the longitudinal direction via the driving device 44.

Similarly, as shown in FIGS. 26 and 27, a driving device (driving section) 45, which slidably drives the fourth strip member ST41 in the longitudinal direction (Z direction), i.e., which drives the fourth strip member ST41 by pushing and pulling the fourth strip member ST41, is connected to each of the fourth strip members ST41. In this case, it is assumed that the driving device 45 is incorporated into the holding portion 43, and the driving device 45 is depicted as the same portion as the holding portion 43 in FIG. 27. Therefore, in the projection optical system PL of this embodiment, the shape of the portion (right half in FIGS. 26 and 27) of the shape of the aperture of the aperture diaphragm S of the projection optical system PL, other than or different from the portion defined by the plurality of third strip members ST31, can be changed by slidably driving the fourth strip member ST41 in the longitudinal direction via the driving device 45.

In this way, the plurality of third strip members ST31 and the plurality of fourth strip members ST41 are moved back and forth with respect to the light flux 41 respectively, thereby making it possible to form the aperture shape, which relates to the three-dimensional curved line corresponding to NA to be defined, with the mutually opposing or facing end edges of the third strip members ST31 and the fourth strip members ST41.

In FIGS. 26 and 27, twelve pieces of the third strip members ST31 and twelve pieces of the fourth strip members ST41 are depicted respectively for the convenience of illustration. However, each of the third strip members ST31 can be specifically provided, for example, as a partial cylinder obtained by cutting and dividing the substantially semicylindrical first strip member ST11 shown in FIG. 16 of the third embodiment described above into eighteen at pitches of the central angle of 10° vertically (in the Z direction). Similarly, each of the fourth strip members ST41 can be also specifically provided, for example, as a partial cylinder obtained by cutting and dividing the substantially semicylindrical second strip member ST21 shown in FIG. 16 of the third embodiment described above into eighteen at pitches of the central angle of 10° vertically (in the Z direction). Therefore, in this case, one set, which includes eighteen pieces of the third strip members ST31 and eighteen pieces of the fourth strip members ST41, i.e., the thirty-six strip members in total, is used to construct one set of the aperture diaphragm defining one NA.

In this embodiment, the sliding directions of the third strip members ST31 and the fourth strip members ST41 are the Z direction as viewed in FIG. 26. However, it is not necessarily indispensable that the sliding direction should be the Z direction. The sliding direction may be inclined with respect to the Z direction (except that the sliding direction is perpendicular to the Z direction). The sliding directions of the third strip members ST31 and the fourth strip members ST41 are the mutually identical direction (Z direction). However, it is not necessarily indispensable that the sliding directions should be identical with each other. It is appropriate that the sliding directions are set or defined in a direction suitable to avoid any mechanical interference, for example, with the mirror constructing the optical system (and the lens when the optical system includes the lens) as well as the holding member thereof.

As described above, the aperture diaphragm S of this embodiment is constructed so that the aperture shape can be defined by the plurality of third strip members ST31 and the plurality of fourth strip members ST41 which are movable back and forth in the Z direction along the shape defined by the holding portions 42, 43. Therefore, the shape of the aperture can be changed three-dimensionally arbitrarily or in the stepwise manner for the predetermined NA.

A driving device, which causes each of the plurality of third strip members ST31 to slide with a mechanism RP1 constructed of, for example, a rack and pinion, can be used as the driving device 44 for causing each of the plurality of third strip members ST31 to slide, in the same manner as the driving device shown in FIG. 8 in the second embodiment described above. Also in this case, the driving device 44 may have an actuator constructed of a linear motor connected to each of the plurality of third strip members ST31, instead of the mechanism RP1 constructed of the rack and pinion or the like, and the driving device 44 may be constructed so as to cause each of the plurality of third strip members ST31 to slide by the motive power from one of the actuators.

The driving device 45 which causes each of the plurality of fourth strip members ST41 to slide may be constructed in the same manner as that for the third strip members ST31.

The driving device 44 is constructed such that the driving device 44 is driven by a predetermined amount based on the control signal from the unillustrated controller or control section so that the plurality of third strip members ST31 can form at least the part (first portion) of the contour of the aperture shape concerning the three-dimensional shape. Further, the driving device 45 is constructed such that the driving device 45 is driven by a predetermined amount based on the control signal from the unillustrated controller or control section so that the plurality of fourth strip members ST41 can form at least the part (second portion) of the contour of the aperture shape concerning the three-dimensional shape.

In this way, the aperture diaphragm S of this embodiment is constructed so that the aperture shape concerning the three-dimensional shape thereof can be formed by the plurality of third strip members ST31 and the plurality of fourth strip members ST41. Further, the aperture diaphragm S is constructed so that the plurality of third strip members ST31 are allowed to slide independently respectively by the driving device 44, and the plurality of fourth strip members ST41 are allowed to slide independently respectively by the driving device 45. Accordingly, it is possible to easily perform the three-dimensional fine adjustment for the aperture shape to be formed.

It is desirable that the shape of the aperture, which is formed by the aperture diaphragm S, is a smooth shape in view of the imaging performance of the optical system. Accordingly, it is desirable that the shapes of the end edges (upper end edges shown in FIG. 26) of the third strip members ST31 of this embodiment are inclined line shapes or curved line shapes to extend along the three-dimensional shape concerning the optimum pupil shape of the optical system, in accordance with the gist or viewpoint having been explained with reference to FIG. 9 in the second embodiment described above.

In order to smoothen the shape of the aperture, it is appropriate to make the design along the three-dimensional shape concerning the optimum pupil shape of the optical system by, for example, the shape-defining member 61 or 62 in accordance with the gist or viewpoint explained with reference to FIG. 11 or 12 in the second embodiment described above. The fourth strip member ST41 may be similarly designed as well. Accordingly, the shape of the aperture can be formed to be a smoother three-dimensional shape by the third strip members ST31 and the fourth strip members ST41. Therefore, it is possible to reduce the setting error of the numerical aperture NA of the projection optical system PL defined by the aperture diaphragm S.

In view of the fact that the aperture shape of the aperture diaphragm S of this embodiment is approximated to the three-dimensional shape concerning the optimum pupil shape to some extent, it is desirable that the widths in the transverse direction of the third strip member ST31 and the fourth strip member ST41 are narrow as much as possible within a range in which the production can be performed. By making the widths of the third strip member ST31 and the fourth strip member ST41 in the transverse direction to be thinner and by increasing the numbers thereof, it is possible for the plurality of third strip members ST31 to form at least the part of the aperture shape of the aperture diaphragm S more highly accurately. However, the following problem newly arises in some cases when the number of the third strip members ST31 is increased. That is, the mechanical construction is complicated for the driving device 44, 45 for causing each of the third strip members ST31 to slide (number of the mechanisms RP1 constructed of racks, pinions, etc. which constructs the driving device is increased); and further that generation of the dust and the chemical pollutant formed by the sliding driving is enhanced in some cases. Therefore, it is desirable to provide an appropriate number in view of the both viewpoints.

Next, an explanation will be made about a modification of the third strip member ST31 and the fourth strip member ST41. Also in this modification, the optical system and the exposure apparatus, in which the third strip members ST31 and the fourth strip members ST41 are arranged, are constructed in the same manner as in the embodiment described above. In the following description, the constitutive parts or components, which are the same as or equivalent to those of the embodiment described above, are designated by the same reference numerals, any explanation of which will be simplified or omitted.

Figure 28:
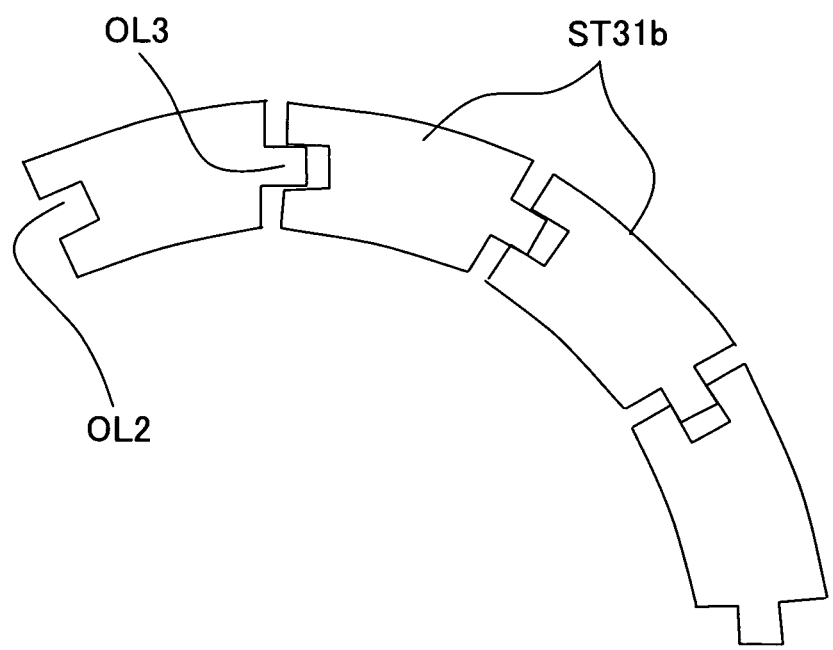
FIG. 28 shows a modification of strip members in the fourth embodiment of the present invention.

FIG. 28 shows shapes of third strip members ST31b in this modification. As shown in FIG. 28, the plurality of third strip members ST31b have recessed portions OL2 each of which is disposed on one side surface (surface opposite to or facing an adjoining third strip member) and protruding portions OL3 each of which is disposed on the other side surface on the side opposite to the one surface (surface opposite to or facing an adjoining third strip member). The recessed portions OL2 and the protruding portions OL3 are formed in the longitudinal direction respectively. Each of the protruding portions OL3 is constructed to be loosely fitted to one of the recessed portions OL2 of the adjoining third strip member ST31 with a slight or small gap intervening therebetween.

The plurality of third strip members ST31b are arranged substantially in parallel to one another respectively while allowing the protruding portions OL2 to be loosely fitted to the mutually opposing recessed portions OL3. Owing to the construction as described above, it is possible to reduce the leakage of the exposure light from the mutual gaps between the plurality of third strip members ST31b. The shapes of the plurality of third strip members ST31b are not limited to the structure described above. Any other structure may be adopted provided that it is possible to reduce the leakage of the exposure light from the mutual gaps between the plurality of third strip members ST31b. FIG. 28 has been explained as exemplified by the third strip members ST31b by way of example. However, the fourth strip members ST41b may be also constructed in the same manner as the third strip members ST31b.

The three-dimensional shape, which relates to the optimum pupil shape, is slightly changed partially or entirely in some cases in accordance with the pattern distribution in the field (distribution of the pattern formed on the mask M), which has been explained in the third embodiment described above. In the aperture diaphragm S according to the fourth embodiment, the plurality of third strip members ST31 and the plurality of fourth strip members ST41 can be made to slide in the Z direction. Therefore, it is possible to more appropriately respond to the case in which the three-dimensional aperture shape concerning the optimum pupil shape is changed in accordance with the pattern distribution as described above. The measuring device and the measuring method for the pattern distribution of the mask M are the same as or equivalent to those described in the second embodiment, any explanation of which is omitted.

The size of the aperture cannot be changed by using only one set of the aperture diaphragm including the third strip members ST31, the fourth strip members ST41, the holding portions 42, 43, the driving devices 44, 45, etc. as described above. Therefore, the situation, in which NA is required to be changed, cannot be dealt therewith. In such a situation, a plurality of sets of the aperture diaphragms are provided, each of which is constructed in the same manner as the one set of the aperture diaphragm described above and which are constructed to define the apertures having different sizes respectively depending on a plurality of NA's which are set in a stepwise manner.

The respective sets of the aperture diaphragms are successively arranged from the inner side in accordance with an order from those which define the larger apertures and those which define the smaller apertures. The third strip members ST31 and the fourth strip members ST41, which relate to the aperture diaphragm to define the aperture corresponding to the selected NA, are slidably driven to be inserted to arrive at the predetermined positions in the optical path. The third strip members ST31 and the fourth strip members ST41, which relate to the other aperture diaphragms, are retracted from the optical path. In this way, by constructing the aperture diaphragm S with the plurality of sets of the aperture diaphragms described above, it is possible to appropriately form the aperture having the three-dimensional shape concerning the optimum pupil shape, depending on the change of NA.

In the embodiment of the present invention, the projection optical system PL is not limited to the optical system constructed of the respective six aspherical or non-spherical mirrors PM1 to PM6. It is also possible to use a catoptric or reflecting optical system constructed of mirrors of any other number, for example, eight mirrors or ten mirrors. The present invention is preferably usable for the catoptric optical system constructed of the mirrors as the reflecting optical elements. However, there is no limitation to this. The present invention is also applicable to the cata-dioptric optical system constructed by combining mirrors as the reflecting optical elements and lenses as the refracting optical elements, and the dioptric optical system constructed by combining lenses as the refracting optical elements.

It is desirable that the EUV light (exposure light), which is radiated from the light source device 1 of the embodiment of the present invention, has the wavelength of not more than 50 nm in order to achieve the high resolution. As an example, it is desirable to use a wavelength of 11.8 nm or 13.5 nm.

The aperture diaphragms S concerning the respective embodiments described above can be also applied to the illumination optical system. That is, with reference to FIG. 1, the aperture diaphragm S as described above can be also applied on the pupil plane of the illumination optical system ILS or at the position located in the vicinity of the pupil plane. In this case, the aperture diaphragm S is arranged on the pupil plane of the illumination optical system ILS or at the position located in the vicinity thereof.

It is enough that the illumination optical system ILS of the embodiment of the present invention is constructed to illuminate the inside of the exposure field on the pattern surface of the mask M. There is no special limitation in relation to the specified construction thereof.

The aperture diaphragm S as explained in the embodiments described above can be also applied to those other than the optical system of the exposure apparatus. In particular, the aperture diaphragm S can be effectively used for the optical system including, for example, a catoptric or reflecting optical system which is in rotational asymmetry in relation to the optical axis.

The driving device 14 which drives the aperture diaphragm plates 12, 13 explained in the first embodiment, the driving devices 21, 22, 44, 45 which drives the first to fourth strip members ST1, ST2, ST31, ST41 defining the aperture shape of the aperture diaphragm S of the second and fourth embodiments, and the driving devices DR1, DR2 which moves the first and second light shielding members ST11, ST21 defining the aperture shape of the aperture diaphragm S of the third embodiment can be controlled by the controller or the control section which controls the exposure apparatus EX. In this case, the controller of the exposure apparatus EX can adjust the aperture of the aperture diaphragm S to the desired three-dimensional shape by controlling the driving device depending on NA of the projection optical system PL to be used.

The lengthy or elongated plate-shaped members are used for the strip members and the light shielding members in the embodiments described above. However, it is also allowable to use any arbitrary shape provided that the end portion of the aperture diaphragm S defining the aperture shape and those disposed in the vicinity thereof are shaped to shield the illumination light. It is also allowable that the shape of the end portion is different from the shape of any portion other than the end portion. For example, it is allowable to make only the end portion to be flat plate-shaped, and to make the remaining portion to be rod-shaped. Corresponding to this, it is possible to appropriately change the form of engagement with the holding portion holding the strip member or the light shielding member and the driving section driving the same.

In the foregoing description, it is assumed to use the semiconductor wafer W as the substrate to serve as the exposure objective. However, the substrate, which serves as the exposure objective, is not limited to only the semiconductor wafer for producing the semiconductor device. It is also allowable to use a glass substrate for a display device, a ceramic wafer for a thin film magnetic head, a master plate (synthetic silica glass, silicon wafer) for a mask or a reticle to be used in the exposure apparatus, or a film member, etc.

The shape of the substrate is not limited to the circular shape. It is also allowable to use any other shape including, for example, the rectangular shape. The form of the exposure apparatus, to which the optical system of the embodiment of the present invention is applied, is not limited to the scanning type exposure apparatus (scanning stepper) of the step-and-scan system in which the scanning exposure is performed for the pattern of the mask M by synchronously moving the mask M and the wafer W as described above; and may be a projection exposure apparatus (stepper) of the step-and-repeat system in which the pattern of the mask M is subjected to the full field exposure in such a state that the mask M and the wafer W are allowed to stand still, and the wafer W is successively step-moved.

The scanning type exposure apparatus of the embodiment of the present invention is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, the piping connection of the air pressure circuits in correlation with the various subsystems, and the like. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness, etc. are managed.

Next, an explanation will be made about a method for producing an electronic device using the exposure apparatus according to the embodiment of the present invention.

Figure 29:
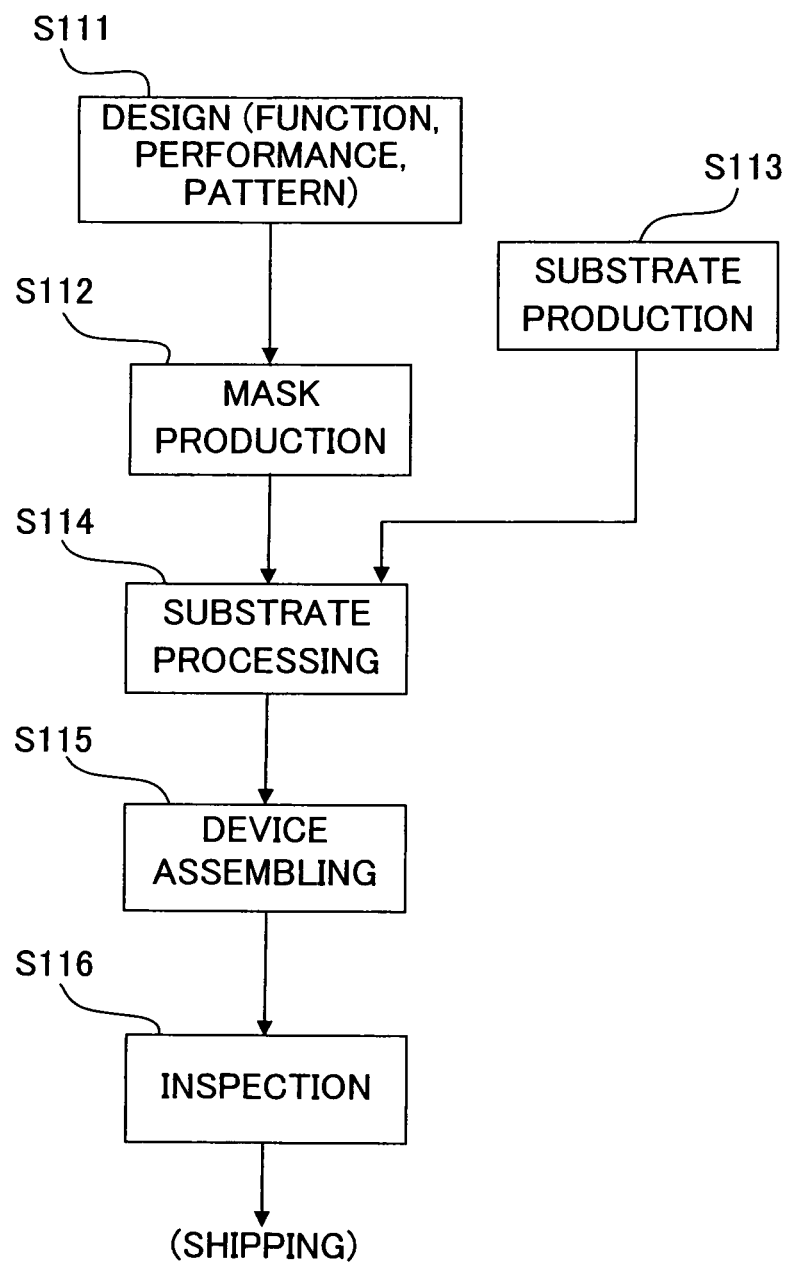
FIG. 29 shows a flow chart illustrating the outline of a method for producing an electronic device in an embodiment of the present invention.

In a case that an electronic device such as a semiconductor device (a microdevice) is produced by using the exposure apparatus of the embodiment described above, as shown in FIG. 29, the electronic device is produced by performing a step 111 of designing the function and the performance of the electronic device; a step 112 of manufacturing a mask (reticle) based on the designing step 111; a step 113 of producing a substrate (wafer) as a base material for the device; a substrate-processing step 114 including a step of exposing the substrate with the pattern of the mask by the exposure apparatus of the embodiment described above, a step of developing the exposed substrate, a step of heating (curing) and etching the developed substrate, etc.; a step 115 of assembling the device (including processing processes such as a dicing step, a bonding step, and a packaging step); an inspection step 116; and the like. In other words, the method for producing the device includes the lithography step, and the photosensitive substrate is exposed by using the exposure apparatus of the embodiment described above in the lithography step.

In the present invention, it is possible to appropriately combine and use all of the constitutive elements described above. Alternatively, a part or parts of the constitutive elements is/are not used in some cases. The foregoing embodiments have been described so that the present invention can be understood more easily, and are not described in order to restrict or limit the present invention. Therefore, the respective elements, which are disclosed in the embodiments described above, also include all of equivalents and modifications of design belonging to the technical scope of the present invention.

EXAMPLES

Simulation of Optimum Pupil Shape

Figure 31:
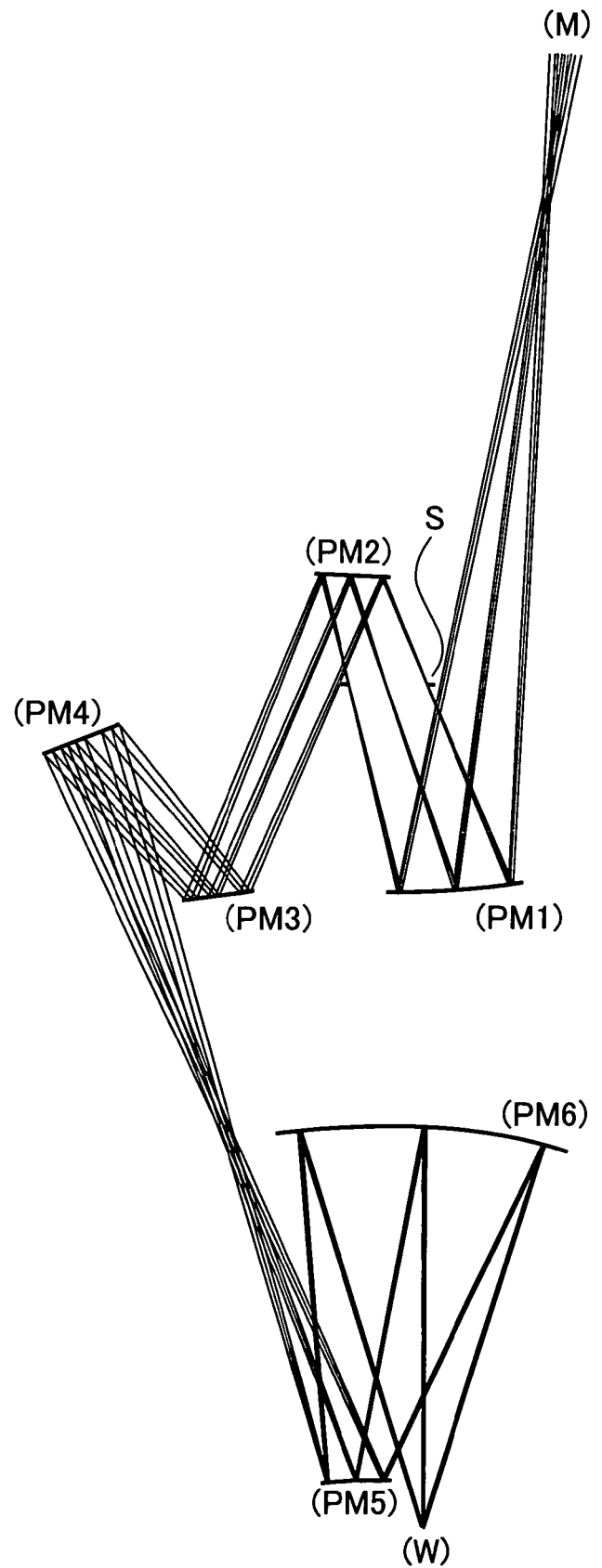
FIG. 31 shows a ray (light beam) tracing diagram in an embodiment of the present invention.

The simulation of the optimum pupil shape was carried out based on the following conditions. Those used were NA: 0.25, the reticle surface: 132 mm to 140 mm, and the wafer surface: 33 mm to 35 mm. Table 1 shows the surface data, Table 2 shows the wave aberration, and Table 3 shows the aspherical surface data. The ray tracing (geometric calculation) was carried out under the conditions as described above to determine the positions of the minimum circles of confusion at nine points (R1 to R9) in the field. R1 represents the main light beam. Obtained results are shown in Table 4. The Z coordinate in Table 4 represents the pupil height. FIG. 31 shows a ray tracing diagram in relation to this case.

TABLE 1

| Surface number | r | d |
| --- | --- | --- |
| Mask surface |  | 734.1885292 |
| M1 | −720.3874193 | −217.5955792 |
| Diaphragm | ∞ | −112.5233792 |
| M2 | −1050.949872 | 322.6738112 |
| M3 | 888.4397399 | −210.050432 |
| M4 | 582.3726141 | 826.8495883 |
| M5 | 305.7931258 | −366.3138463 |
| M6 | 445.1455501 | 416.1472924 |
| Wafer surface |  |  |

TABLE 2

| X direction (mm) | Y direction (mm) | Wave aberration (mλrms) |
| --- | --- | --- |
| 0 | 33 | 19.1 |
| 0 | 34 | 8.2 |
| 0 | 35 | 16.6 |

TABLE 3

| Aspherical data | PM1 | PM2 | PM3 |
| --- | --- | --- | --- |
| Conic constant (K) | 0 | 0 | 0 |
| 4th order coefficient (A) | 1.340058E−09 | −3.360456E−09 | −1.215467E−09 |
| 6th order coefficient (B) | −1.924849E−14 | 8.434585E−14 | −2.468357E−15 |
| 8th order coefficient (C) | 4.067775E−19 | −9.499991E−18 | 4.266577E−19 |
| 10th order coefficient (D) | 2.403474E−23 | −3.987856E−22 | −9.808037E−24 |
| 12th order coefficient (E) | −6.243282E−27 | 2.446681E−24 | −3.033823E−28 |
| 14th order coefficient (F) | 5.967375E−31 | −1.087847E−27 | 2.251650E−32 |
| 16th order coefficient (G) | −2.84E−35 | 2.07E−31 | −4.82E−37 |
| 18th order coefficient (H) | 5.47E−40 | −1.52E−35 | 3.65E−42 |

| Aspherical data | PM4 | PM5 | PM6 |
| --- | --- | --- | --- |
| Conic constant (K) | 0 | 0 | 0 |
| 4th order coefficient (A) | 3.378127E−10 | 8.791129E−10 | 9.592647E−11 |
| 6th order coefficient (B) | −1.005523E−14 | 1.646777E−12 | 5.197436E−16 |
| 8th order coefficient (C) | 1.591787E−19 | −5.963808E−17 | 7.741593E−21 |
| 10th order coefficient (D) | −1.501604E−24 | −9.567914E−20 | −6.486157E−25 |
| 12th order coefficient (E) | 7.854905E−30 | 1.063594E−22 | 5.458118E−29 |

TABLE 3-continued

| | | | |
|---|---|---|---|
| 14th order coefficient (F) | −2.131010E−35 | −5.508497E−26 | −2.606073E−33 |
| 16th order coefficient (G) | 5.27E−41 | 1.45E−29 | 6.71E−38 |
| 18th order coefficient (H) | −2.01E−46 | −1.55E−33 | −7.18E−43 |

TABLE 4

| Diaphragm central coordinate (0, 0, 0) | X coordinate | Y coordinate | Z coordinate |
|---|---|---|---|
| R1 | 0 | 0 | 0 |
| R2 | 0 | −33.6662374 | 2 |
| R3 | 0 | 33.70243986 | −6 |
| R4 | −33.8191831 | −0.58571655 | −3 |
| R5 | 33.81918317 | −0.58571653 | −3 |
| R6 | −23.9327 | −24.1021 | 0 |
| R7 | −23.9206 | 23.9947 | −5 |
| R8 | 23.9327 | −24.1021 | 0 |
| R9 | 23.9362 | 23.9947 | −5 |

What is claimed is:

1. An optical system comprising:
a projection optical system having a plurality of optical elements; and
an aperture diaphragm which defines a light flux on a predetermined plane;
wherein a contour of an aperture shape of the aperture diaphragm has a three-dimensional shape, and a contour of a pupil of the projection optical system has the three-dimensional shape of the aperture diaphragm.

2. The optical system according to claim 1, further comprising a reflection type optical element which has a multi-layer film composed of at least two materials stacked with each other.

3. The optical system according to claim 1, wherein the predetermined plane is a pupil plane of the optical system or a plane located in the vicinity of the pupil plane.

4. The optical system according to claim 1, wherein the aperture shape of the aperture diaphragm is variable depending on a numerical aperture of the optical system.

5. The optical system according to claim 4, further comprising a first variable light shielding member which has a plurality of first light shielding members and which defines a first portion of the aperture shape of the aperture diaphragm.

6. The optical system according to claim 5, wherein an arbitrary aperture shape, which is located on an arbitrary three-dimensional curved surface, is formed by end edges of the plurality of first light shielding members by movement of the first light shielding members with respect to the light flux respectively.

7. The optical system according to claim 5, wherein the plurality of first light shielding members are strip-shaped first plate-shaped members respectively; and the first light shielding members are arranged respectively so that a longitudinal direction thereof is parallel to a predetermined first direction and that the first light shielding members are disposed closely to one another in a transverse direction thereof.

8. The optical system according to claim 7, further comprising a second driving section which moves the plurality of first light shielding members in an optical axis direction of the optical system or in a direction intersecting the predetermined plane.

9. The optical system according to claim 7, further comprising a first driving section which pushes and pulls each of the plurality of first light shielding members in the first direction.

10. The optical system according to claim 7, wherein a predetermined field area of the optical system is disposed at a position which is eccentric in a third direction with respect to an optical axis of the optical system; and
the first direction is a direction which is substantially perpendicular to the third direction.

11. The optical system according to claim 5, wherein each of the first light shielding members is a semicylindrical or partially cylindrical member having a cross-sectional shape which is circular-arc shaped, elliptical arc-shaped, or curvedly shaped similarly thereto, and having one end edge which is three-dimensionally shaped.

12. The optical system according to claim 11, further comprising a driving section which moves each of the plurality of first light shielding members back and forth in an optical axis direction of the optical system or in a first back and forth movement direction as a direction intersecting the predetermined plane.

13. The optical system according to claim 12, wherein each of the plurality of first light shielding members is arranged in a direction substantially perpendicular to the first back and forth movement direction; and each of the first light shielding members is arranged with one end edge thereof being directed toward the predetermined plane.

14. The optical system according to claim 5, wherein the first light shielding members are strip-shaped plate-shaped members; and
the first variable light shielding member is semicylindrical or partially cylindrical with a cross-sectional shape thereof which is circular-arc shaped, elliptical arc-shaped, or curvedly shaped similarly thereto.

15. The optical system according to claim 14, wherein the plurality of first light shielding members are arranged respectively closely to one another in a transverse direction thereof.

16. The optical system according to claim 14, further comprising a driving section which pushes and pulls each of the plurality of first light shielding members in a longitudinal direction thereof.

17. The optical system according to claim 5, further comprising a second variable light shielding member which has a plurality of second light shielding members and which defines a second portion, of the aperture shape of the aperture diaphragm, different from the first portion.

18. The optical system according to claim 17, wherein an arbitrary aperture shape, which is located on an arbitrary three-dimensional curved surface, is formed by end edges of the plurality of second light shielding members by movement of the second light shielding members with respect to the light flux respectively.

19. The optical system according to claim 17, wherein the plurality of second light shielding members are strip-shaped second plate-shaped members respectively; and the second light shielding members are arranged respectively so that a longitudinal direction thereof is parallel to a predetermined second direction and that the second light shielding members are disposed closely to one another in a transverse direction thereof.

20. The optical system according to claim 19, wherein the first direction and the second direction are substantially parallel to one another.

21. The optical system according to claim 19, further comprising a third driving section which pushes and pulls each of the plurality of second light shielding members in the second direction.

22. The optical system according to claim 19, further comprising a fourth driving section which moves the plurality of second light shielding members in an optical axis direction of the optical system or in a direction intersecting the predetermined plane.

23. The optical system according to claim 17, wherein each of the second light shielding members is a semicylindrical or partially cylindrical member having a cross-sectional shape which is circular-arc shaped, elliptical arc-shaped, or curvedly shaped similarly thereto, and having one end edge which is three-dimensionally shaped.

24. The optical system according to claim 23, further comprising a driving section which moves each of the plurality of second light shielding members back and forth in an optical axis direction of the optical system or in a second back and forth movement direction as a direction intersecting the predetermined plane.

25. The optical system according to claim 24, wherein each of the plurality of second light shielding members is arranged in a direction substantially perpendicular to the second back and forth movement direction, and each of the second light shielding members is arranged with the one end edge thereof being directed toward the predetermined plane.

26. The optical system according to claim 23, wherein the first variable light shielding member and the second variable light shielding member are arranged to be opposite to each other, with the predetermined plane intervening therebetween.

27. The optical system according to claim 23, wherein the first light shielding members and the second light shielding members are moved back and forth mutually opposingly.

28. The optical system according to claim 23, wherein the first back and forth movement direction and the second back and forth movement direction are substantially parallel to each other.

29. The optical system according to claim 17, wherein the second light shielding members are strip-shaped plate-shaped members; and
the second variable light shielding member is semicylindrical or partially cylindrical with a cross-sectional shape thereof which is circular-arc shaped, elliptical arc-shaped, or curvedly shaped similarly thereto.

30. The optical system according to claim 29, wherein the plurality of second light shielding members are arranged respectively while being disposed closely to one another in a transverse direction thereof.

31. The optical system according to claim 29, further comprising a driving section which pushes and pulls the plurality of second light shielding members in a longitudinal direction respectively.

32. The optical system according to claim 31, wherein a direction in which the first light shielding members are pushed and pulled by the driving section and a direction in which the second light shielding members are pushed and pulled by the driving section are substantially parallel to each other.

33. The optical system according to claim 1, further comprising an aperture diaphragm plate, a contour of an aperture shape of which has a three-dimensional shape.

34. The optical system according to claim 33, further comprising a driving section which moves the aperture diaphragm plate back and forth so that the aperture diaphragm plate is selectively movable back and forth with respect to an optical path for the light flux.

35. The optical system according to claim 1, further comprising a plurality of aperture diaphragm plates, contours of aperture shapes of which have mutually different three-dimensional shapes;
wherein the aperture diaphragm plates are arranged so that the aperture diaphragm plates are selectively exchangeable with respect to an optical path for the light flux.

36. The optical system according to claim 35, wherein the plurality of aperture diaphragm plates have aperture portions which correspond to numerical apertures of the optical system respectively.

37. The optical system according to claim 1, wherein the optical system is an imaging optical system which images a predetermined field area, on an object plane, onto an image plane.

38. The optical system according to claim 37, wherein the predetermined field area of the optical system is located at a position which is eccentric in a third direction with respect to an optical axis of the optical system.

39. The optical system according to claim 1, wherein the light flux is an EUV light.

40. An exposure apparatus which projects an image on a first plane onto a second plane to perform exposure, the exposure apparatus comprising the optical system as defined in claim 1.

41. The exposure apparatus according to claim 40, wherein the projection optical system which projects the image on the first plane onto the second plane, the projection optical system being the optical system.

42. The exposure apparatus according to claim 40, further comprising an EUV light source device which supplies the light flux.

43. A method for producing an electronic device, including a lithography step, wherein the exposure apparatus as defined in claim 40 is used in the lithography step.

44. An optical system comprising:
a projection optical system having at least two reflecting optical elements;
an aperture diaphragm, wherein a contour of an aperture shape of the aperture diaphragm has a three-dimensional shape; and
a pupil in an optical path between two reflecting optical elements, a contour of the pupil having the three-dimensional shape of the aperture diaphragm.

45. The optical system according to claim 44, wherein the pupil is an area in which a minimum circle of confusion of light beams each passing through the optical system is formed or a surface which is in contact with the area.

46. The optical system according to claim 44, wherein the aperture diaphragm is arranged on the pupil or on a surface disposed in the vicinity of the pupil.

47. The optical system according to claim 44, wherein the optical system is an imaging optical system which images a predetermined field area, on an object plane, onto an image plane.

48. The optical system according to claim 47, wherein the predetermined field area is located for the optical system at a position which is eccentric in a predetermined direction with respect to an optical axis of the optical system.

49. An exposure apparatus which projects an image on a first plane onto a second plane to perform exposure, the exposure apparatus comprising the optical system as defined in claim 44.

50. The exposure apparatus according to claim 49, wherein the projection optical system which projects the image on the first plane onto the second plane, the projection optical system being the optical system.

51. The exposure apparatus according to claim 49, further comprising an EUV light source device which supplies the light flux.

52. A method for producing an electronic device, including a lithography step, wherein the exposure apparatus as defined in claim 49 is used in the lithography step.

53. An aperture diaphragm restricting a light flux which comes into an optical system or which exits from the optical system, the aperture diaphragm comprising a member which has an inner circumferential portion defining an aperture;

wherein the inner circumferential portion of the member exists on a curved surface formed such that a plane, which intersects a main light beam of the light flux, is partially warped in a direction of the main light beam and has a three-dimensional shape so that a pupil of the optical system has the three-dimensional shape of the aperture diaphragm.

54. The aperture diaphragm according to claim 53, wherein the member is an aperture diaphragm plate.

55. The aperture diaphragm according to claim 54, wherein the lengthy members are movable in a longitudinal direction thereof, and a shape of the curved surface is changed by regulating positions of end portions of the lengthy members.

56. The aperture diaphragm according to claim 53, wherein the member is formed by a plurality of lengthy members which extend in a direction intersecting the main light beam; and the aperture is defined by arrangement of end portions of the lengthy members.

57. The aperture diaphragm according to claim 56, wherein the pair of semicylindrical members have a plurality of pairs of semicylinders having different curvatures respectively; and a shape of the curved surface is defined by end portions of a pair of semicylinders selected from the plurality of pairs of semicylinders depending on NA of the optical system.

58. The aperture diaphragm according to claim 53, wherein the member is formed of a pair of semicylindrical members which extend in a direction intersecting the main light beam; and the aperture is defined by end portions of the pair of semicylindrical members.

59. The aperture diaphragm according to claim 58, further comprising a driving device which moves the pair of semicylindrical members in an extending direction thereof.

60. An optical system comprising a plurality of reflecting optical elements, the optical system further comprising the aperture diaphragm as defined in claim 53 which is arranged on a pupil plane or a surface disposed in the vicinity of the pupil plane.

61. An exposure apparatus comprising:

a projection optical system; and the aperture diaphragm as defined in claim 53 which is provided on a pupil plane of the projection optical system or in the vicinity of the pupil plane.

62. The exposure apparatus according to claim 61, wherein the plane, which intersects the main light beam, is perpendicular to an optical axis of the projection optical system.

63. The exposure apparatus according to claim 61, further comprising first to fourth reflecting mirrors which are disposed on an object side of the projection optical system;

wherein an illumination light is made to come into the projection optical system via the first to fourth reflecting mirrors;

a pupil of the projection optical system is positioned in an optical path between the second and third reflecting mirrors; and the inner circumferential portion of the member is defined by arrangement of end portions of a plurality of lengthy members extending in a direction intersecting the main light beam or by a pair of semicylindrical members, parts of the plurality of lengthy members or one of the semicylindrical members being provided between the first reflecting mirror and the third reflecting mirror, and remaining parts other than the parts of the plurality of lengthy members or the other of the semicylindrical members being provided between the second reflecting mirror and the fourth reflecting mirror.

* * * * *